United States Patent
Hattori

(10) Patent No.: US 7,348,867 B2
(45) Date of Patent: Mar. 25, 2008

(54) FILTER AND COMPOSITE FILTER, FILTER ASSEMBLY, INTEGRATED CIRCUIT CHIP AND ELECTRONIC DEVICE WHICH CONTAIN SAME, AND FREQUENCY CHARACTERISTIC CHANGING METHOD THEREFOR

(75) Inventor: Wataru Hattori, Tokyo (JP)

(73) Assignee: NEC Corporation (JP)

( * ) Notice: Subject to any disclaimer, the term of this patent is extended or adjusted under 35 U.S.C. 154(b) by 535 days.

(21) Appl. No.: 10/528,605

(22) PCT Filed: Sep. 17, 2003

(86) PCT No.: PCT/JP03/11837

§ 371 (c)(1),
(2), (4) Date: Mar. 21, 2005

(65) Prior Publication Data
US 2007/0082642 A1 Apr. 12, 2007

(51) Int. Cl.
*H03H 9/54* (2006.01)
*H03H 3/04* (2006.01)

(52) U.S. Cl. ............ 333/186; 333/187; 333/189; 333/188

(58) Field of Classification Search ......... 333/186, 333/187, 189, 193, 188
See application file for complete search history.

(56) References Cited

U.S. PATENT DOCUMENTS

| | | | |
|---|---|---|---|
| 5,640,133 A * | 6/1997 | MacDonald et al. | 333/197 |
| 5,955,932 A * | 9/1999 | Nguyen et al. | 333/186 |
| 5,976,994 A * | 11/1999 | Nguyen et al. | 438/795 |
| 6,249,073 B1 * | 6/2001 | Nguyen et al. | 310/309 |
| 7,095,295 B1 * | 8/2006 | Stalford et al. | 333/186 |

FOREIGN PATENT DOCUMENTS

| | | |
|---|---|---|
| JP | 05-251977 | 9/1993 |
| JP | 06-006174 | 1/1994 |
| JP | 2001-094062 | 4/2001 |
| JP | 2001-203556 | 7/2001 |

OTHER PUBLICATIONS

Frank D. Bannon, III, et al.; "High-Q HF Microelectromechanical Filters"; IEEE Journal of Solid-State Circuits; vol. 35(4); Apr. 2000; pp. 512-526.

* cited by examiner

*Primary Examiner*—Barbara Summons
(74) *Attorney, Agent, or Firm*—Dickstein, Shapiro, LLP.

(57) ABSTRACT

A dual-mode acoustic wave resonator (7a) having a resonance mode inter-coupler (6) is disposed across narrow voids (4, 5) from an input electrode (2) and an output electrode (3). They are supported for vibrations on a substrate by conductive posts (27, 28, 29) and a power supply pad (3). Opposing electrodes (10, 11, 21, 23) are formed below the input and output electrodes (2, 3), resonator (7a), and resonance mode inter-coupler (6) across narrow gaps. As a voltage of a power supply (25) is changed, a distortion of the resonator (7a) changes due to an electrostatic force, causing a change in the center resonance frequency. As voltages of power supplies (16, 17) are changed, distortions of the input and output electrodes (2, 3) change to cause a change in the opposing areas of end faces of the input and output electrodes to the resonator (7a). This causes a change in the situation of exchanging energy between the input and output electrodes and the resonator (7a) to change the external Q-value. As the voltage of the power supply (25) is changed, a distortion of the inter-coupler (6) changes to cause a change in the coupling coefficient between the resonance modes.

22 Claims, 18 Drawing Sheets

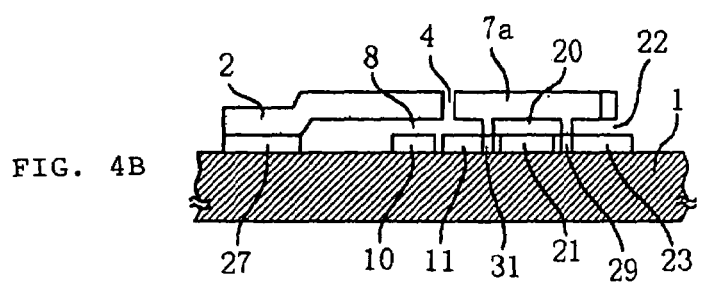
FIG. 4B
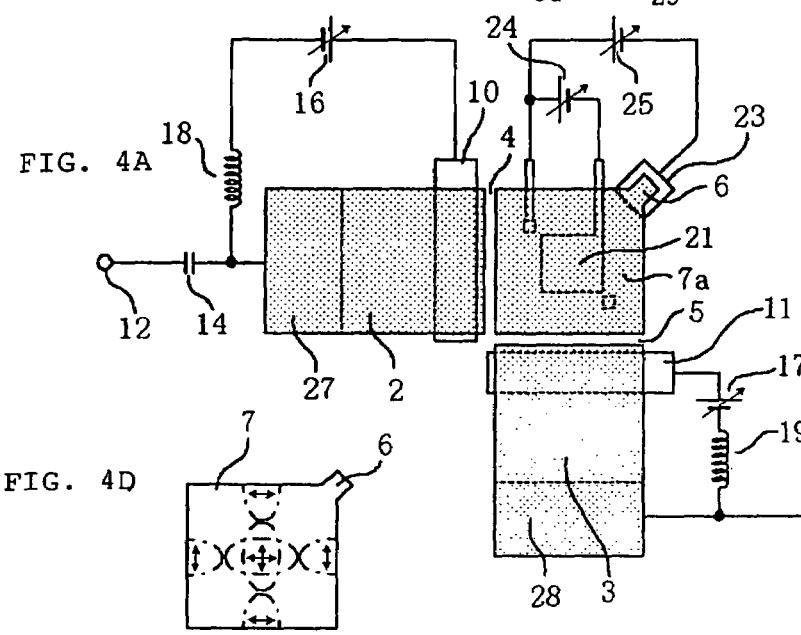
FIG. 4A
FIG. 4D
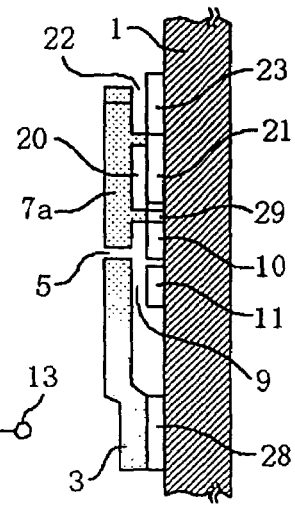
FIG. 4C

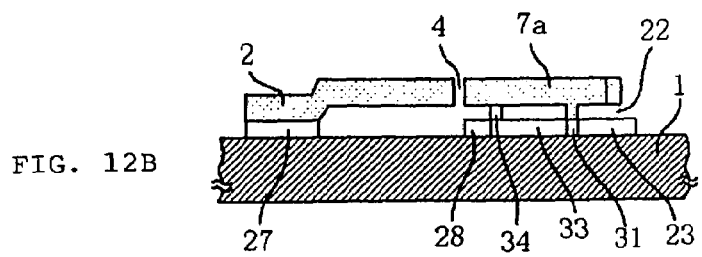
FIG. 12B
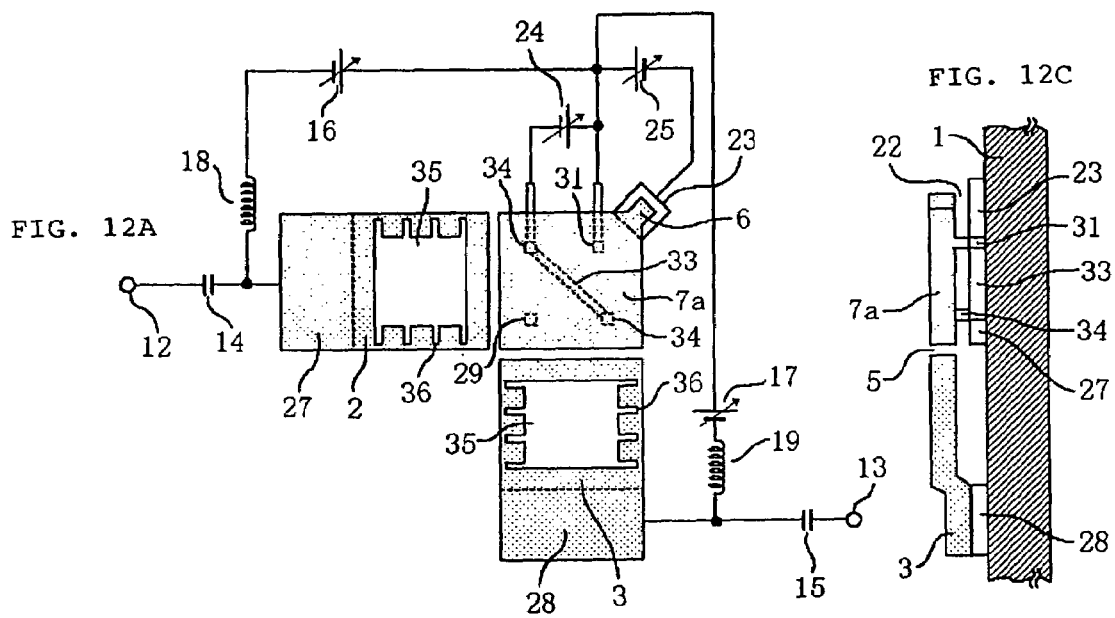
FIG. 12A
FIG. 12C

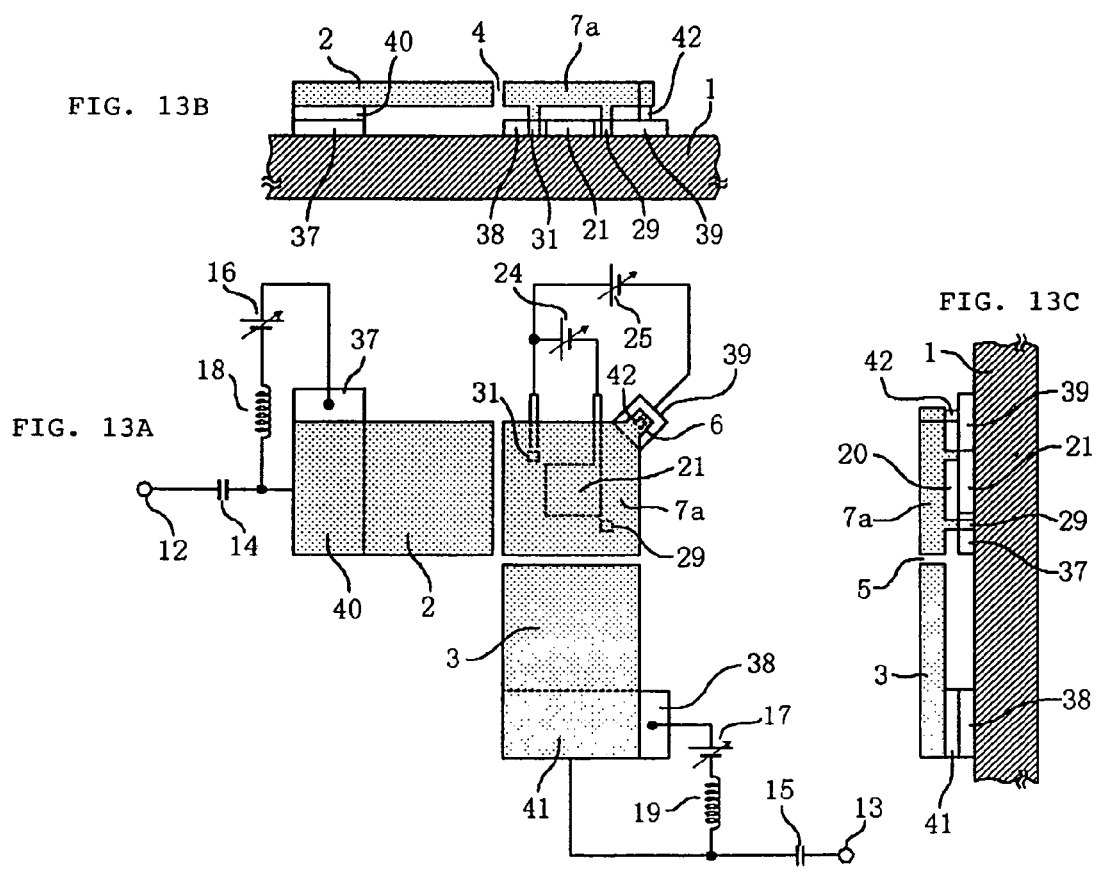

US 7,348,867 B2

FILTER AND COMPOSITE FILTER, FILTER ASSEMBLY, INTEGRATED CIRCUIT CHIP AND ELECTRONIC DEVICE WHICH CONTAIN SAME, AND FREQUENCY CHARACTERISTIC CHANGING METHOD THEREFOR

TECHNICAL FIELD

The present invention relates to filters for use in telecommunication circuits, and a frequency characteristic changing method therefor, and more specifically, to a filter fabricated using an acoustic wave resonator with the employment of micro-electromechanical system (MEMS) technologies, a frequency characteristic changing method therefor, as well as electronic devices such as a mobile telephone, a telecommunication device and the like which have the filter mounted therein.

BACKGROUND ART

At present, in radio telecommunication systems represented by wireless LAN, mobile telephone systems, and so on, modulation/demodulation schemes, assigned frequencies, and the like are different depending on differences in system and country. Under such a situation, developments are now actively under way for a software radio which can support a variety of systems with one type of radio. In this software radio, it is desired that not only a modulation scheme but also a used radio frequency can be changed by modifications in software. To implement such a function, it is desired that a center frequency and a bandwidth can also be varied in an arbitrary manner in a filter for selecting only a desired frequency band from frequencies of radiowaves which are transmitted/received by an antenna. However, with currently used surface acoustic wave filters, dielectric filters, or laminated ceramic filters, or SAW filters, it is extremely difficult to provide a mechanism for varying the center frequency and bandwidth, as desired in the software radio. Also, a magnetostatic wave filter is known as a device which is a filter that is available in GHz bands and has a variable center frequency, but even with this device, it is difficult to arbitrarily change the bandwidth.

In recent years, as disclosed in JP-2001-94062-A (Reference 1), there has been an increase in developments for narrow-band filters for intermediate frequency bands with the advance of micro-electromechanical system (MEMS) technologies. This type of filter couples a plurality of miniature resonators between the input and the output to pass signals at a desired frequency therethrough and attenuate signals at other frequencies and noise. In a filter which is fabricated using such MEMS technologies, there exist shifts from and variations in a designed value for a center frequency of a resonator associated with the frequency characteristics of the filter; shifts from and variations in a designed value for a coupling coefficient between resonators; and shifts from and variations in a designed value for an external Q-value of a desired frequency signal which couples an input/output unit and a resonator. Reference 1 describes, as a method of adjusting such shifts and variations in the frequency characteristics, that the density of a silicon conductive layer is varied through ion implantation, or that the resonators are changed in thickness. Therefore, the technique described in Reference 1 is incapable of adjusting the frequency characteristics by a movable mechanism which is instructed in software and is mechanically controllable with electric signals.

Frank D. Bannon, III, John R. Clark, and Clark T.-C. Nguyen, "High-Q HF Microelectromechanical Filters," IEEE Journal of Solid-State Circuits, Vol. 35, No. 4, 512-526 (2000) (Reference 2) discloses a method of adjusting such shifts and variations in the frequency characteristics by a movable mechanism which is integrated by the MEMS technologies and is mechanically controllable with electric signals.

The method of Reference 2 adjusts the center frequency of a resonator by applying a DC voltage between an input/output unit of a desired frequency signal and the resonator for purposes of adjusting shifts from and variations in a designed value for the center frequency, among other frequency characteristics of the filter. In this way, several methods of partially adjusting the frequency characteristics of a filter, limited to the center frequency, have been proposed in the past, as disclosed in Reference 2.

However, in filters using the conventional MEMS technologies, there has not so far been proposed any filter which can adjust shifts from and variations in design values with respect to general frequency characteristics of a filter, i.e., all characteristics such as the center frequency, bandwidth, rejection characteristic, insertion loss, and phase characteristic. For adjusting such general frequency characteristics, it is necessary to adjust, if it concerns a single-stage filter, all three parameters: the center frequency of a resonator, an external Q-value between an input electrode and the resonator, and an external Q-value between an output electrode and the resonator independently of one another. Here, the single-stage filter refers to a filter which has only one resonance mode for use as a filter. In the case of a plural-stage filter which has a plurality of resonance modes for use as a filter, the center frequency of a resonator, a coupling coefficient between the resonance modes, and an external Q-value for coupling an input/output unit of a desired frequency signal with the resonator must be made individually adjustable to their respective design values. For example, while Reference 2 shows that the center frequency of the resonator can be adjusted to a desired value by applying DC voltages between input/output electrodes and resonator to deflect the resonator, this method simultaneously makes the coupling stronger, caused by an electrostatic force, between the input/output unit of a desired frequency signal and the resonator, because the deflected resonator narrows down the spacing between the input/output electrode and resonator. Consequently, when the center frequency is adjusted, the external Q-value is also changed.

Also, even in an MEMS filter which can adjust shifts and variations in part of the frequency characteristics by a movable mechanism fabricated by such MEMS technologies and mechanically controllable with electric signals, there has not so far been contemplated any system which can change the frequency characteristics to support a variety of standards having different frequency bands and center frequencies by varying the frequency characteristics of the filter in an electrically controllable form, as is required by the software radio.

DISCLOSURE OF THE INVENTION

It is an object of the present invention to provide a small-sized and high performance filter, using the MEMS technologies, which is capable of modifying shifts and variations of the general frequency characteristics to respective desired design values, respectively, by a movable mechanism integrated by the MEMS technologies and mechanically controllable with electric signals, and is capable of changing the frequency characteristics to support a variety of standards, which have different frequency bands and center frequencies, by varying the general frequency characteristics of the filter individually to desired target values in an electrically controllable form, as is required for a software radio, a frequency characteristic changing method therefor, and a small-sized and reliable electronic device which is equipped with the foregoing filter.

To achieve the above object, according to the present invention, there is provided a filter having an input electrode, an output electrode, and a single acoustic wave resonator disposed between the input electrode and the output electrode, formed on a substrate, and having one resonance mode for use as a filter, characterized by having a number of structures capable of simultaneously and independently changing all parameters for determining frequency characteristics of the filter, wherein the parameters include a center frequency of the acoustic wave resonator, an external Q-value between the acoustic wave resonator and the input electrode, and an external Q-value between the acoustic wave resonator and the output electrode, the structures are capable of being simultaneously applied with electric signals independently of one another, and the number of structures is at least equal to the number of the parameters, and including an electromechanical transducer having a function capable of mechanically deforming one portion of each of the structures of the filter simultaneously and with finite dependency by individually applying the electric signals to electrodes disposed in the structures.

Also, to achieve the above object, according to the present invention, there is provided a filter having an input electrode, an output electrode, and a resonator unit including at least one acoustic wave resonator disposed between the input electrode and the output electrode and comprising a plurality of acoustic wave resonance modes for use as a filter within the acoustic wave resonator, wherein the input electrode, output electrode, and resonator unit are formed on a substrate, characterized by having a number of structures capable of simultaneously and independently changing all parameters for determining frequency characteristics of the filter, wherein the parameters include a coupling coefficient between the plurality of resonance modes of the resonator unit, a center frequency, an external Q-value between the acoustic wave resonator and the input electrode, and an external Q-value between the acoustic wave resonator and the output electrode, the structures are capable of being simultaneously applied with electric signals independently of one another, and the number of structures is at least equal to the number of the parameters, and including an electromechanical transducer having a function capable of mechanically deforming one portion of each of the structures of the filter simultaneously and with finite dependency by individually applying the electric signals to electrodes disposed in the structures.

Also, to achieve the above object, according to the present invention, there is provided a filter which is characterized in that the electromechanical transducer is a mechanism which is capable of mechanically deforming a portion of each of the structures of the filter through an electrostatic force or through deformation of a piezoelectric material by applying the electric signal.

Also, to achieve the above object, according to the present invention, there is provided a filter which is characterized in that end faces of the acoustic wave resonator are opposite to an end face of the input electrode and an end face of the output electrode across predetermined gaps, and the filter includes, as the electromechanical transducer, a mechanism for changing the distances between the end faces of the acoustic wave resonator and the end faces of the input electrode and the output electrode, or areas of the end faces that are opposite to each other through an electrostatic force or through deformation of a piezoelectric material.

Also, to achieve the above object, according to the present invention, there is provided a filter which is characterized by including, as the electromechanical transducer, a mechanism for mechanically deforming a portion of the acoustic wave resonator through an electrostatic force or through deformation of the piezoelectric material.

Also, to achieve the above object, according to the present invention, there is provided a filter which is characterized in that an electromechanical transducer is a mechanism which changes a tension applied to an acoustic wave resonator with a mechanical deformation of a portion of the acoustic wave resonator.

Also, to achieve the above object, according to the present invention, there is provided a filter which is characterized in that an input electrode, an acoustic wave resonator, and an output electrode are formed of a semiconductor or a metal or an insulating material having a surface covered with a semiconductor or a metal.

Also, to achieve the above object, according to the present invention, there is provided a filter which is characterized in that a local oscillator is connected to at least one of an input electrode or an acoustic wave resonator or an output electrode.

Also, to achieve the above object, according to the present invention, there is provided a filter which is characterized by comprising a storage circuit for storing values corresponding to the electric signals which realize the center frequency and the external Q-value of the acoustic wave resonator compatible with desired frequency characteristics, and an applied voltage generator for reading a stored value from the storage circuit, converting the stored value to the electric signal, and delivering the electric signal, wherein the electric signal delivered by the applied voltage generator is used as an input signal to an electromechanical transducer.

Also, to achieve the above object, according to the present invention, there is provided a filter which is characterized by comprising a storage circuit for storing values corresponding to electric signals which realize a coupling coefficient between resonance modes, a center frequency, and an external Q-value of a resonator unit compatible with desired frequency characteristics, and an applied voltage generator for reading a stored value from the storage circuit, converting the stored value to an electric signal, and delivering the electric signal, wherein the electric signal delivered by the applied voltage generator is used as an input signal to the electromechanical transducer.

Also, to achieve the above object, according to the present invention, there is provided a filter which is characterized in that the storage circuit is implemented by a digital circuit, and the applied voltage generator includes a digital/analog converter as a component thereof.

Also, to achieve the above object, according to the present invention, there is provided a filter which is characterized by comprising a mechanism for applying an electric signal delivered by the applied voltage generator to the electromechanical transducer through a booster circuit or a voltage reduction circuit or an amplifier circuit.

Also, to achieve the above object, according to the present invention, there is provided a filter which is characterized in that the storage circuit and/or applied voltage generator are partially or entirely formed on the same substrate as the substrate on which the acoustic wave resonator is formed.

Also, to achieve the above object, according to the present invention, there is provided a composite filter which is characterized by comprising a plurality of the filter according to claim 1 in parallel, which have different ranges from one another in which the center frequency can be changed.

Also, to achieve the above object, according to the present invention, there is provided a composite filter which is characterized in that an amplifier is connected in series to each filter.

Also, to achieve the above object, according to the present invention, there is provided a composite filter which is characterized in that the respective filters are separated from one another by an isolator.

Also, to achieve the above object, according to the present invention, there is provided a composite filter which is characterized in that a circulator is connected to a branch point to each filter.

Also, to achieve the above object, according to the present invention, there is provided a composite filter which is characterized in that a switch and/or a variable phase shifter are connected in series to each filter.

Also, to achieve the above object, according to the present invention, there is provided a composite filter which is characterized by comprising a storage circuit for storing on/off of the switch or an adjustment value for the phase by the variable phase shifter connected in series with each filter for realizing a combination of filters which provide desired frequency characteristics.

Also, to achieve the above object, according to the present invention, there is provided a composite filter which is characterized in that each filter is formed on the same substrate.

Also, to achieve the above object, according to the present invention, there is provided a composite filter which is characterized in that each filter and all or part of devices connected to each filter are formed on the same substrate.

Also, to achieve the above object, according to the present invention, there is provided a filter assembly which is characterized by comprising the foregoing filter or composite filter hermetically sealed in a package.

Also, to achieve the above object, according to the present invention, there is provided a filter assembly which is characterized by including a gettering material disposed within the package.

Also, to achieve the above object, according to the present invention, there is provided an integrated circuit chip which is characterized by comprising the filter or composite filter integrated on the same substrate as part of a circuit.

Also, to achieve the above object, according to the present invention, there is provided an electronic device which is characterized by containing the filter, composite filter, or integrated circuit chip.

Also, to achieve the above object, according to the present invention, there is provided a method of changing frequency characteristics of a filter, characterized by applying a first electric signal to mechanically deform an acoustic wave resonator to change the center frequency of the resonator, and applying a second and a third electric signal to change a relative position of an input electrode to the acoustic wave resonator and to change a relative position of an output electrode to the acoustic wave resonator to change an external Q-value.

Also, to achieve the above object, according to the present invention, there is provided a method of changing frequency characteristics of a filter, characterized by applying a first electric signal to mechanically deform an acoustic wave resonator to change the center frequency of a plurality of resonance modes of the resonator unit, applying a second and a third electric signal to change a relative position of an input electrode to the acoustic wave resonator and to change a relative position of an output electrode to the acoustic wave resonator to change an external Q-value, and applying one or a plurality of fourth electric signals to deform each of a plurality of sites which provide coupling between resonance modes of the resonator unit to change a coupling coefficient between the resonance modes.

Also, to achieve the above object, according to the present invention, there is provided a method of changing frequency characteristic of a filter, characterized in that a storage circuit previously stores values corresponding to electric signals which realize a center frequency and an external Q-value of a resonator compatible with desired frequency characteristics, and an applied voltage generator, upon changing the frequency characteristics of the filter, reads the stored value from the storage circuit, and applies a formed electric signal to an electromechanical transducer of the filter to change the frequency characteristics of the filter.

Also, to achieve the above object, according to the present invention, there is provided a method of changing frequency characteristic of a filter, characterized in that a storage circuit previously stores values corresponding to electric signals which realize a center frequency, an external Q-value, and a coupling coefficient between resonance modes of a resonator compatible with desired frequency characteristics, and an applied voltage generator, upon changing the frequency characteristics of the filter, reads the stored value from the storage circuit, and applies a formed electric signal to an electromechanical transducer of the filter to change the frequency characteristics of the filter.

Also, to achieve the above object, according to the present invention, there is provided a method of changing frequency characteristics of a composite filter, characterized by changing the frequency characteristics of each filter to change the frequency characteristics of the composite filter.

Also, to achieve the above object, according to the present invention, there is provided a method of changing frequency characteristics of a composite filter, characterized in that a switch connected in series to each filter is turned on/off, and/or the phase is adjusted by a variable phase shifter to change the frequency characteristics of the composite filter in order to realize desired frequency characteristics.

Thus, the present invention arranges the input and output electrodes and the acoustic wave resonator adjacent to them on the substrate, and enables the center frequency of the resonator, the coupling coefficient between the resonance modes, and the external Q-value to be individually changed by the electromechanical transducer, thus making it possible to arbitrarily change the frequency characteristics of the filter, so that the present invention can provide a filter which satisfies characteristics required by telecommunication devices such as a software radio, and electronic devices, and a method of changing its frequency characteristics. Also, according to the present invention, it is possible to appropriately correct the frequency characteristics for shifts caused by manufacturing-induced variations.

Also, when the filter and associated peripheral circuit are integrated on the same substrate, it is possible to reduce the size of the device and improve the reliability. Also, in an electronic device such as a telecommunication device which contains the filter according to the present invention, a cost-down can be achieved for the product, in addition to the ability to reduce the size of the device and improve the reliability.

BRIEF DESCRIPTION OF THE DRAWINGS

FIGS. 4A-4D are a top view, a front view, a side view, and an operation description diagram illustrating a first example of the present invention;

FIGS. 12A-12C are a top plan view, a front view, and a side view illustrating a second example of the present invention;

FIGS. 13A-13C are a top plan view, a front view, and a side view illustrating a third example of the present invention;

1 Substrate
1a Si Substrate
1b SiN film
1c Semi-insulating GaAs Substrate
2, 101 Input Electrodes
3, 102 Output Electrodes
4, 5, 8, 9, 20, 22 Voids
6, 6a, 6b, 105 Resonance Mode Inter-Couplers
7a, 104 Dual-Mode Acoustic Wave Resonators
7b, 103 Acoustic Wave Resonators
7c Triple-Mode Acoustic Wave Resonator
10, 11, 21, 23, 23a Opposing Electrodes
12 Received Signal Input Terminal
13 Output Terminal
14, 15 Decoupling Capacitors
16, 17, 24, 25, 47, 48 Variable Voltage Sources
18, 19 Inductors
27, 28, 29 Conductive Posts
31 Power Supply Pad
33, 37, 38, 39, 43, 44 Power Supply Lines
34, 40, 41, 42 Piezoelectric Posts
35 Opening
36 Notch
45, 46 Absorption Electrodes
49 Local Oscillator
50, 52, 57 Al Films
51, 56 SiO2 Films
53 SiN film
54, 55 Insulating Posts
201 Higher-Rank Control Circuit
202 Control Circuit
203 Storage Circuit
204 Digital/Analog Converter
205 Booster Circuit
301 Antenna
302, 304 Amplifiers
303 Filter which can be modified in frequency characteristics
305 Switch
306 Isolator
307 Terminal
308 Circulator
309 Variable Phase Shifter
401 Desired Frequency Characteristics
403, 404 Frequency Characteristics of Single Filter
501 Substrate
502 Filter
503 Peripheral Circuit
504 Pad
505 Bonding Wire
506 Package Base
507 Package Lid
508 External Terminal
509 Gettering Material
d1-d3 Gaps

BEST FORM FOR CARRYING OUT THE INVENTION

Next, embodiments of the present invention will be described in detail with reference to the drawings.

Figure 1A:
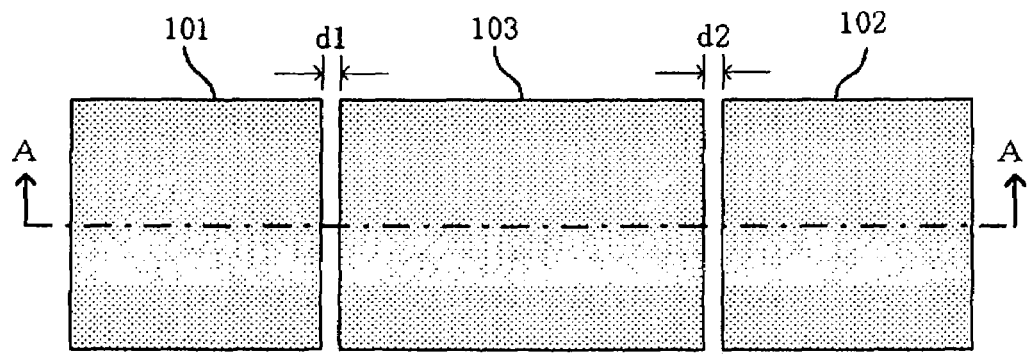
FIGS. 1A-1C are plan views illustrating a first to a third embodiment of the present invention.
Figure 2A:
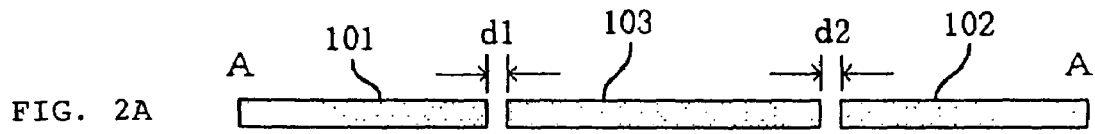
FIGS. 2A-2D are cross-sectional views and operation description diagrams in the first embodiment of the present invention.

FIG. 1A is a schematic plan view illustrating a first embodiment of the present invention, and FIG. 2A is a cross-sectional view taken along A-A line in FIG. 1A. A filter according to this embodiment comprises input electrode 101, output electrode 102, and square acoustic wave resonator 103 which is formed across gaps d1, d2 from input electrode 101 and output electrode 102, respectively. Though depending on electrode areas and applied voltages, gaps d1, d2 are preferably formed approximately 100 nm or less from a viewpoint of a reduction in an operating voltage and the like, and preservation of a required external Q-value. These are supported on a substrate, the illustration of which is omitted, and are generally or partially deformable or movable associated with deformation by a mechanical driving force which is electromechanically transduced. Input electrode 101, output electrode 102, and acoustic wave resonator 103 are formed of a conductive material, i.e., a semiconductor, a metal, an insulating material covered with a semiconductor or a metal on the surface, or the like, but they are not necessarily formed of the same material. Preferred materials may be silicon, aluminum, aluminum alloy containing iron, lanthanum or the like, titanium, chromium, elinvar alloy, and identity elastic alloy, though not limited to them. They may be formed in a single crystal form or in an amorphous form.

As a mechanical force for driving input/output electrodes 101, 102 and acoustic wave resonator 103, while any driving force formed through electromechanical transduction can be used, an electrostatic force and deformation in piezoelectric material are preferably used. The substrate which supports input/output electrodes 101, 102 and acoustic wave resonator 103 can be formed of a semiconductor such as Si. GaAs, InP, GaN, a metal, an insulating material, and a composite material of these. When a semiconductor or a metal material is used, the surface is covered with an insulating material as required.

Figure 2B:
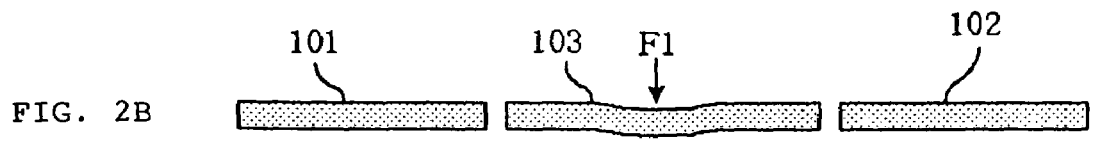

As illustrated in FIG. 2B, when mechanical force F1 is applied to acoustic wave resonator 103 to deform or distort this, acoustic wave resonator 103 is applied with a tension, causing an increase in resonant frequency. In other words, the center frequency of acoustic wave resonator 103 can be changed.

Figure 2C:
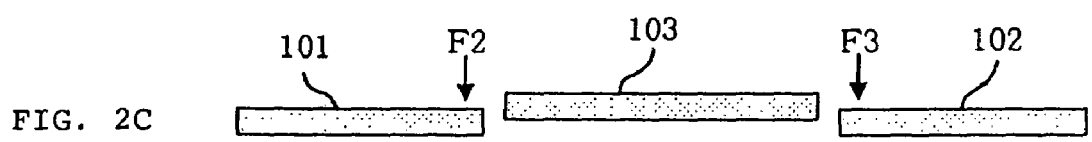

Also, as illustrated in FIG. 2C, when mechanical forces F2, F3 are applied to sites of input electrode 101 and output electrode 102 close to acoustic wave resonator 103 to deform or distort these sites, this causes a reduction of the opposing area of an end face of input electrode 101 to an end face of acoustic wave resonator 103, and the opposing area of an end face of output electrode 102 and acoustic wave resonator 103. As a result, coupling of electromagnetic waves becomes weaker between input electrode 101 and acoustic wave resonator 103 and between output electrode 102 and acoustic wave resonator 103, causing an associated reduction in the strength of acoustic waves transmitted from input electrode 101 to acoustic wave resonator 103 through an electrostatic force. In other words, the external Q-value increases.

Figure 2D:
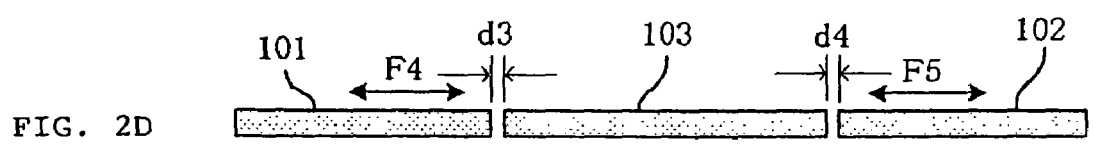

Also, as illustrated in FIG. 2D, when horizontal mechanical forces F4, F5 are applied to input electrode 101 and output electrode 102 to move input electrode 101 and output electrode 102 in the horizontal direction to change the gaps between input electrode 101 and acoustic wave resonator 103 and between output electrode 102 and acoustic wave resonator 103 to d3, d4, respectively, coupling of electromagnetic waves changes between input electrode 101 and acoustic wave resonator 103, and between output electrode 102 and acoustic wave resonator 103. In this way, the external Q-value can be changed as well. The deformations which cause a change in the center frequency and a change in the external Q-value need not be necessarily independent of each other. For example, in the case of FIG. 2D, when an electrostatic force is used to generate mechanical forces F4 and F5 between input electrode 101 and acoustic wave resonator 103 or between output electrode 102 and acoustic wave resonator 103, a slight tension is also applied to acoustic wave resonator 103, causing a change in the center frequency in some cases. In this event, the change in the center frequency is not completely independent of the deformation which causes a change in the external Q-value. However, by simultaneously making F1 in FIG. 2B independently adjustable, the changed center frequency can be returned to a desired value. In other words, even if the aforementioned deformation is not completely independent, it is possible to independently change the center frequency and change the external Q-value. Therefore, by providing at least the same number of all parameters which determine the frequency characteristics of the filter, and disposing an electromechanical transducer which can simultaneously and independently apply electric signals, all the parameters can be simultaneously changed independently of one another.

For adjusting the center frequency and external Q-value of the resonator of the filter configured as described above to desired values, the electromechanical transducer for forming the aforementioned forces F1, F2, F3 (or F4, F5) is applied with DC electric signals for controlling these forces to appropriate values. An electric signal forming circuit for forming the electric signals reads stored values corresponding to a sequence of electric signals for realizing the center frequency and the external Q-value of a resonator having used frequency characteristics from a storage device which stores values corresponding to a sequence of electric signals for realizing center frequencies of a sequence of resonators which are compatible with a variety of frequency characteristics, and external Q-values, and the external Q-value, and forms electric signals to be applied to the electromechanical transducer based on them. All or part of these electric signal forming circuit and storage device are preferably formed on the same substrate as the substrate which is formed with the input/output electrodes and acoustic wave resonator. In this way, the number of parts can be reduced to accomplish a reduction in price, an improvement in reliability, and the like.

Also, a mixer function can be additionally provided by applying the DC electric signals, connecting a local oscillator to at least one of the input electrode, the acoustic wave resonator or the output electrode, and multiplexing a local oscillation signal.

Also, a variable range for the center frequency which can be realized by a filter element configured as described above is narrow as compared with a desired variable range in a software radio and the like. For this reason, the filter element is likely to fail to realize a required variable range for the center frequency. In this event, a plurality of unit filters, which differ in a range in which the center frequency can be changed, can be connected in parallel to cover a wider frequency variable range. These unit filters connected in parallel are preferably formed on the same substrate. In this way, the number of parts can be reduced to accomplish a reduction in price, an improvement in reliability, and the like.

Figure 1B:
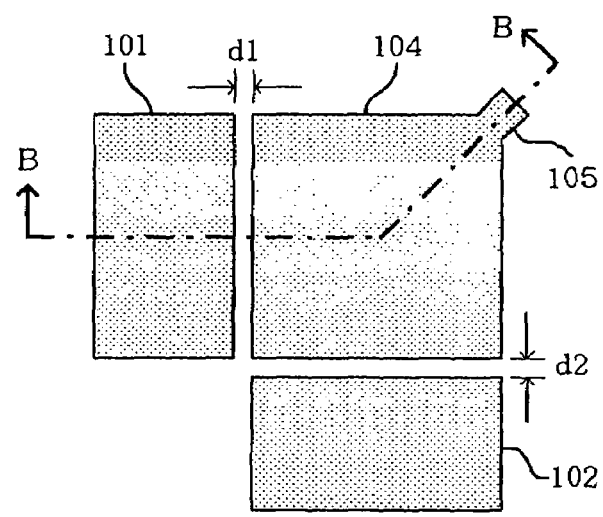
Figure 3A:
FIGS. 3A-3E are cross-sectional views and operation description diagrams in the second and third embodiments of the present invention.

FIG. 1B is a schematic plan view illustrating a second embodiment of the present invention, and FIG. 3A is a cross-sectional view taken along B-B line in FIG. 1B. A filter according to this embodiment comprises input electrode 101, output electrode 102, and dual-mode acoustic wave resonator 104 formed across gaps d1, d2 from input electrode 101 and output electrode 102, respectively, generally in a square shape as viewed on a plane. Dual-mode acoustic wave resonator 104 is formed with resonance mode inter-coupler 105 at a corner away from input electrode 101 and output electrode 102 for coupling resonances of two modes. They are supported on a substrate, the illustration of which is omitted, and are entirely or partially movable or deformable with electromechanically converted driving forces.

Input electrode 101, output electrode 102, and acoustic wave resonator 104 are formed of the same materials as the materials for forming the input electrode and the like, as described in the first embodiment. Also, the substrate used for supporting them is similar to that of the first embodiment.

While electrostatic forces and deformation of piezoelectric material are preferably used for the forces formed through electromechanical transduction for driving input/output electrodes 101, 102, dual-mode acoustic wave resonator 104, and resonance mode inter-coupler 105, the forces are not limited to them.

Figure 3B:
Figure 3C:
Figure 3D:
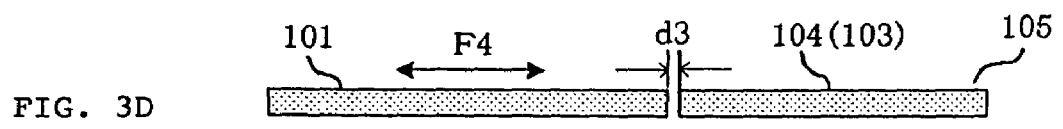
Figure 3E:
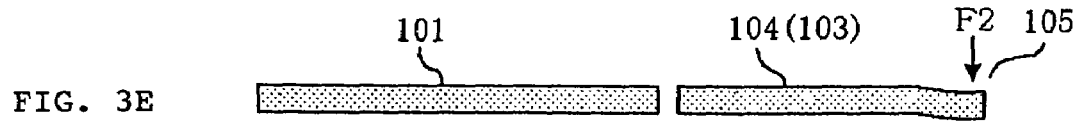

As illustrated in FIG. 3B, when mechanical force F1 is applied to dual-mode acoustic wave resonator 104 to distort the same, dual-mode acoustic wave resonator 104 is applied with a tension, causing an increase in the resonance frequencies in both resonance modes. In this way, the center frequency of dual-mode acoustic wave resonator 104 can be changed. Also, as illustrated in FIG. 3C, when mechanical force F1 is applied to a site of input electrode 101 close to acoustic wave resonator 104 to distort this site (while the input electrode side alone is illustrated and described herein, it should be understood that on the output electrode side, mechanical force F3 is applied to provide substantially similar operations as well), this causes a reduction of an opposing area of an end face of input electrode 101 to an end face of dual-mode acoustic wave resonator 104. As a result, coupling of electromagnetic waves becomes weaker between input electrode 101 and dual-mode acoustic wave resonator 104, causing an associated reduction in the strength of acoustic waves transmitted from input electrode 101 to dual-mode acoustic wave resonator 104 through an electrostatic force. In other words, the external Q-value is increased. Also, as illustrated in FIG. 3D, when input electrode 101 is applied with horizontal mechanical force F4 to move input electrode 101 in the horizontal direction to change the gap between input electrode 101 and dual-mode acoustic wave resonator 104 to d3 (it should be understood hat horizontal mechanical force F5 is also applied on the output electrode side to provide substantially similar operations), coupling of electromagnetic waves changes between input electrode 101 and dual-mode acoustic wave resonator 104. In this way, the external Q-value can be changed as well. Also, as illustrated in FIG. 3E, when mechanical force F6 is applied to resonance mode inter-coupler 105 of dual-mode acoustic wave resonator 104 to distort the same, dual-mode acoustic wave resonator 104 more largely deforms from the square shape, thereby making it possible to change a coupling coefficient between the two resonance modes. The change in the center frequency need not be necessarily completely independent of the deformation which causes the change in the external Q-value and coupling coefficient, as is the case with the first embodiment.

For example, when electrostatic forces are used to generate mechanical forces F4 and F2, respectively, in the case of FIG. 3, acoustic wave resonator 103 may also be applied with a slight tension, causing a change in the center frequency in some cases. In this event, the change in the center frequency is not completely independent of the deformation which causes the change in the external Q-value or coupling coefficient. However, by simultaneously making F1 in FIG. 3B independently adjustable, the changed center frequency can be returned to a desired value. In other words, even if the deformation is not completely independent, it is possible to change the center frequency and change the external Q-value or the coupling coefficient independently of each other. Therefore, by providing at least the same number of all parameters which determine the frequency characteristics of the filter, and disposing an electromechanical transducer which can simultaneously and independently apply nine electric signals, all the parameters can be simultaneously changed independently of one another.

For adjusting the center frequency of the resonator, the coupling coefficient between the resonance modes, and the external Q-value of the filter configured as described above to desired values, the electromechanical transducer for forming the aforementioned forces F1, F2, F3 (or F4, F5), F6 is applied with DC electric signals for controlling these forces to appropriate values. An electric signal forming circuit for forming the electric signals reads stored values corresponding to a sequence of electric signals for realizing the center frequency, the coupling coefficient between the resonance modes, and the external Q-value of a resonator having the used frequency characteristics from a storage device which stores values corresponding to a sequence of electric signals for realizing center frequencies of a sequence of resonators which are compatible with a variety of frequency characteristics, coupling coefficients between the resonance modes, and external Q-values, and forms electric signals to be applied to the electromechanical transducer based on them. All or part of these electric signal forming circuit and storage device are preferably formed on the same substrate as the substrate which is formed with the input/output electrodes and acoustic wave resonator. In this way, the number of parts can be reduced to accomplish a reduction in price, an improvement in reliability, and the like.

Also, a variable range for the center frequency which can be realized by a filter element configured as described above is relatively narrow. For this reason, the filter element is likely to fail to realize a required variable range for the center frequency. In this event, a plurality of unit filters, which differ in a range in which the center frequency can be changed, can be connected in parallel to cover a wider frequency variable range. These unit filters connected in parallel are preferably formed on the same substrate. In this way, the number of parts can be reduced to accomplish a reduction in price, an improvement in reliability, and the like.

Figure 1C:
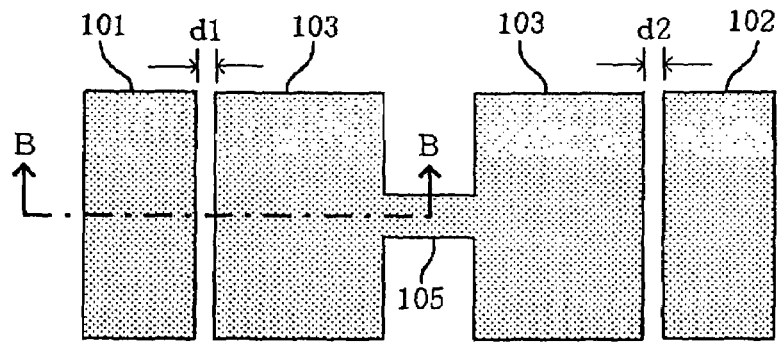

FIG. 1C is a schematic plan view illustrating a third embodiment of the present invention. A cross-sectional view taken along B-B line in FIG. 1C is similar to the cross-sectional view in the second embodiment illustrated in FIG. 3A. A filter according to this embodiment comprises input electrode 101, output electrode 102, and two acoustic wave resonators 103 formed across gaps d1, d2 from input electrode 101 and output electrode 102, respectively, generally in a square shape as viewed on a plane. Resonance mode inter-coupler 105 is formed between two acoustic wave resonators 103 for coupling acoustic waves, each of which resonates at a desired resonance frequency with the two resonators, or resonance modes. They are supported on a substrate, the illustration of which is omitted, and are entirely or partially movable or deformable with electromechanically converted driving forces. Input electrode 101, output electrode 102, acoustic wave resonator 103, and resonance mode inter-coupler 105 as well as the substrate for supporting them are formed of similar materials to those in the first embodiment.

While electrostatic forces and deformation of piezoelectric material are preferably used for the mechanical forces for driving input/output electrodes 101, 102, acoustic wave resonator 103, and resonance mode inter-coupler 105, the forces are not limited to them.

As illustrated in FIG. 3B, when mechanical force F1 is applied to acoustic wave resonator 103 to distort the same, acoustic wave resonator 103 is applied with a tension, so that the center frequency of acoustic wave resonator 103 can be changed. Also, as illustrated in FIG. 3C, when mechanical force F2 is applied to a site of input electrode 101 close to acoustic wave resonator 103 to deform or distort the site (while the input electrode side alone is illustrated and described herein, it should be understood that on the output electrode side, mechanical force F3 is applied to provide substantially similar operations as well), this causes a reduction of an opposing area of an end face of input electrode 101 to an end face of acoustic wave resonator 103. As a result, coupling of electromagnetic waves becomes weaker between input electrode 101 and acoustic wave resonator 103, causing an associated reduction in the strength of acoustic waves transmitted from input electrode 101 to acoustic wave resonator 103 through an electrostatic force. In other words, the external Q-value is increased. Also, as illustrated in FIG. 3D, when horizontal mechanical force F4 is applied to input electrode 101 to move input electrode 101 in the horizontal direction to change the gap between input electrode 101 and dual-mode acoustic wave resonator 104 to d3 (it should be understood hat horizontal mechanical force F5 is also applied on the output electrode side to provide substantially similar operations), the coupling of electromagnetic waves changes between input electrode 101 and acoustic wave resonator 103. In this way, the external Q-value can be changed as well. Also, as illustrated in FIG. 3E, when mechanical force F6 is applied to resonance mode inter-coupler 105 of acoustic wave resonator 103 to distort the same, the coupling degree changes between two acoustic wave resonators 103, thereby making it possible to change a coupling coefficient between the two resonance modes. The change in the center frequency need not be necessarily completely independent of the deformation which causes the change in the external Q-value and coupling coefficient, as is the case with the first and second embodiments. By providing at least the same number of all parameters which determine the frequency characteristics of the filter, and disposing an electromechanical transducer which can simultaneously and independently apply nine electric signals, all the parameters can be simultaneously changed independently of one another.

EXAMPLES

Next, examples of the present invention will be described in detail with reference to the accompanying drawings.

FIG. 4 are diagrams illustrating a first example of the present invention, wherein FIG. 4A is a top plan view which additionally depicts the configuration of peripheral circuits; FIG. 4B is a front view, FIG. 4C is a side view, and FIG. 4D is a schematic diagram for describing the operation of an acoustic wave resonator.

As illustrated in FIG. 4, the filter of this example mainly comprises input electrode 2 and output electrode 3 on substrate 1, and dual-mode acoustic wave resonator 7a disposed therebetween across narrow voids 4, 5 and having the shape of a square except for resonance mode inter-coupler 6, when viewed from above. The vertical and horizontal widths of this dual-mode acoustic wave resonator 7a are chosen to match the length of one waveform when a designed resonance frequency is realized, in consideration of the speed of acoustic waves through a component material. For example, with aluminum, the width is approximately 5 microns for generating a resonance frequency of 1 GHz. Further, since the resonance frequency is more readily increased than is reduced, it is desired that the resonance frequency before variations should be previously designed closest possible to a lower limit of a variable range or at a frequency lower than this during the manufacturing. Also, though a square in this example, the shape of dual-mode acoustic wave resonator 7a is not limited to the square, but the vertical and horizontal widths are intentionally made different to slightly deviate the resonance frequencies, as a design for extending a bandwidth. Input electrode 2 and output electrode 3 are supported by conductive posts 27, 28, respectively, while dual-mode acoustic wave resonator 7a is supported by conductive post 29 and power supply pad 31. Conductive post 29 and power supply pad 31 are disposed at sites which are nodes of vibrations of acoustic wave resonator 7a.

In this filter, as a movable mechanism which can mechanically control the external Q-value with a changeable electric signal, input electrode 2 and output electrode 3 are provided with opposing electrodes 10 and 11 which are disposed in close proximity to the respective electrodes across voids 8 and 9, respectively. Input electrode 2 and output electrode 3 are connected to received signal input terminal 12 and output terminal 13, respectively, through decoupling capacitors 14, 15, so as to prevent DC voltages from leaking. Inductors 18, 19 are also inserted on input terminal 12 and output terminal 13 sides of variable power supplies 16, 17 for cutting AC signals. The resonance frequency generated by capacitor 14 and inductor 18 or capacitor 15 and inductor 19 is set to be sufficiently lower than a desired frequency band of the filter.

Also, as a movable mechanism which can mechanically control the center frequency of dual-mode acoustic wave resonator 7a with a changeable electric signal, dual-mode acoustic wave resonator 7a is provided with opposing electrode 21 which is disposed in close proximity thereto across void 20. Further, as a movable mechanism which can be mechanically control the coupling coefficient between the resonance modes with a changeable electric signal, resonance mode inter-coupler 6 of dual-mode acoustic wave resonator 7a is provided with opposing electrodes 23 disposed in close proximity thereto across void 22. Variable voltage sources 16, 17, 24 and 25 are provided for applying DC electric signals between the respective electrodes. By applying a DC electric signal between the respective electrodes using these variable voltage sources 16, 17, 24 and 25, an electrostatic force can be generated between the respective electrodes to mechanically distort input electrode 2 and output electrode 3, dual-mode acoustic wave resonator 7a or resonance mode inter-coupler 6. Here, voids 8, 9, 20, 22 are formed to be 100 nm or less. In this way, required applied voltages can be suppressed to be low. In the case of input electrode 2 and output electrode 3, DC electric signal are applied between opposing electrodes 10, 11 using variable voltage sources 16, 17, causing input electrode 2 and output electrode 3 to curve toward opposing electrodes 10, 11 such that they reduce the spacings of void 8 and void 9. Therefore, end faces of input electrode 2 and output electrode 3 opposing void 4 and void 5 are out of alignment to end faces of dual-mode acoustic wave resonator 7a. This result in weaker coupling of electromagnetic waves by a capacitance formed by void 4 or void 5, causing an associated reduction in the strength of an acoustic wave converted into a mechanical force through the electrostatic force. In other words, the external Q-value is increased.

For changing the center frequency of dual-mode acoustic wave resonator 7a, a DC electric signal is applied between opposing electrode 21 and dual-mode acoustic wave resonator 72 using variable voltage source 24, causing a central portion of dual-mode acoustic wave resonator 7a to curve toward opposing electrode 21 such that the spacing of void 20 is reduced.

Therefore, dual-mode acoustic wave resonator 7a is applied with a tension, causing an increase in the resonance frequencies in both resonance modes.

Specifically, as can be seen from one-dot chain lines and arrows in FIG. 4D which indicate an envelope of the amplitude of a vertical acoustic wave that is in resonance as a basic wave, the two resonance modes exist within dual-mode acoustic wave resonator 7a, and the resonance frequencies increase together in these two resonance modes. Further, for changing the coupling coefficient between the resonance modes of dual-mode acoustic wave resonator 7a, a DC electric signal is applied between resonance mode inter-coupler 6 and opposing electrode 23 using variable voltage source 25. In this way, a central portion of inter-coupler 6 curves toward opposing electrode 23 so as to narrow down the spacing of void 22, resulting in a larger deviation of dual-mode acoustic wave resonator 7a from the square shape. In dual-mode acoustic wave resonator 7a, energy is exchanged between the two modes through the deviation from the square at inter-coupler 6, thereby permitting the two resonance mode to couple. As such, the coupling coefficient can be changed by distorting inter-coupler 6.

As shown above, the center frequency of the resonator, the coupling coefficient between resonators, and the external Q-value can be electrically controlled to individually change to respective desired values. The center frequency and bandwidth can be first adjusted by changing these three parameters. Also, even with the same center frequency, various types of filters can be chosen, including Chebyshev, Butterworth, Bessel, Gaussian, and the like. The difference in the type of filter results in differences in the cut-off characteristic, insertion loss, and phase characteristic. Therefore, in the filter of this example, changes can be made in regard to the general frequency characteristics, i.e., all of such characteristics as the center frequency, bandwidth, cut-off characteristic, insertion loss, and phase characteristic. Of course, it is possible to adjust shifts from and variations in design values resulting from the manufacturing process.

Figure 5:
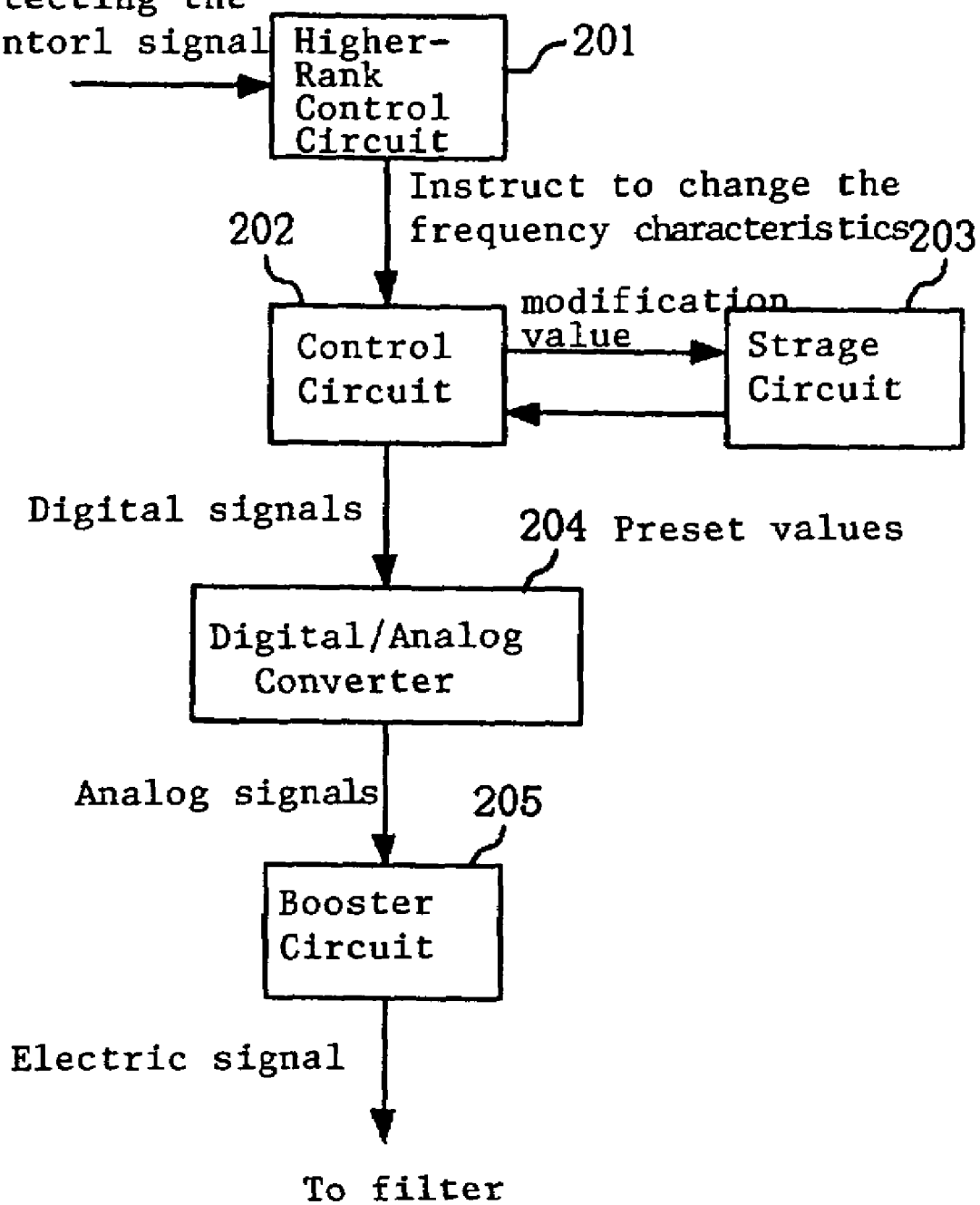
FIG. 5 is a diagram illustrating the configuration of a variable voltage source which is used in the example of the present invention.

Next, the configuration of variable voltage sources 16, 17, 24 and 25 illustrated in FIG. 4 will be described in detail with reference to FIG. 5. FIG. 5 is a block diagram illustrating the configuration of the variable voltage source. For example, control circuit 202 is first instructed from higher-rank control circuit 201 based, for example, on CPU (central processor unit), DSP (digital signal processor) or the like to change the frequency characteristics, for example, to make a change from a currently used radio standard to a different radio standard. Storage circuit 203 previously stores values, for example in a digital form, corresponding to a sequence of electric signals for realizing center frequencies, coupling coefficients between resonance modes, and external Q-values for a sequence of resonators which are compatible with a variety of radio standards. By using a digital circuit, it is possible to implement a circuit immune to aging changes and noise at a low cost. Storage circuit 203 preferably comprises ROM, nonvolatile memory, magnetic disc, magneto-optical disc, optical disc, or RAM with a backup power supply, or a combination of them. Control circuit 202 accesses storage circuit 203 to read preset values corresponding to a sequence of electric signals which realize the center frequencies, the coupling coefficients between the resonance modes, and external Q-values for a sequence of resonators compatible with the desired radio standard. Digital signals, which represent the preset values changed into a necessary form, is sent to digital/analog convertor 204 for conversion into analog signals. Subsequently, the analog signals are sent to booster circuit 205 which converts the analog signals to voltages each corresponding to an associated movable mechanism of the filter which can be mechanically controlled with an electric signal. This signal is applied to the movable mechanism of the filter to change the frequency characteristics of the filter.

Further, fine adjustments can also be made utilizing a control signal within a desired radio standard, or a control signal and a carrier which can be sensed near the frequency band. The result of detecting the received control signal is transmitted to control circuit 202 through higher-rank control circuit 201 together with an instruction for modifying the frequency characteristics. Control circuit 202 stores this modification value in storage circuit 203. Further, the control circuit adds the modification value to the preset values read from storage circuit 203 to newly create a sequence of electric signals for realizing the center frequencies, the coupling coefficients between the resonance modes, and the external Q-value for a sequence of resonators compatible with the desired radio standard. This value is sent to analog/digital converter 204 for conversion into an analog signal. Subsequently, this analog signal is sent to booster circuit 205 for conversion into a voltage which supports each movable mechanism of the filter which can be mechanically controlled with an electric signal. This signal is applied to the movable mechanism of the filter to finely adjust the frequency characteristics of the filter. Also, in this event, the sequence of electric signals for realizing the center frequencies, the coupling coefficients between the resonance modes, and the external Q-values for a sequence of resonators compatible with the desired radio standard may be written into storage circuit 203 in such a form that they overwrite existing values.

Generally, the center frequency, a coupling coefficient between resonance modes, and an external Q-value of a resonator which forms part of a filter vary from one product to another or from one lot to another due to manufacturing-induced variations. Preferably, the frequency characteristics of the filters are measured in a test step after the manufacturing, and modifications are made to the preset values stored in storage circuit 203 on a lot-by-lot basis or on a product-by-product basis based on the result of the measurement.

All or part of the circuit illustrated in FIG. 5 can be formed on a substrate which is formed with the filter. In doing so, an Si substrate is preferably employed for the substrate. Also, booster circuit 205 may be replaced with an amplifier circuit or a voltage reduction circuit, or a combination thereof.

Figure 6:
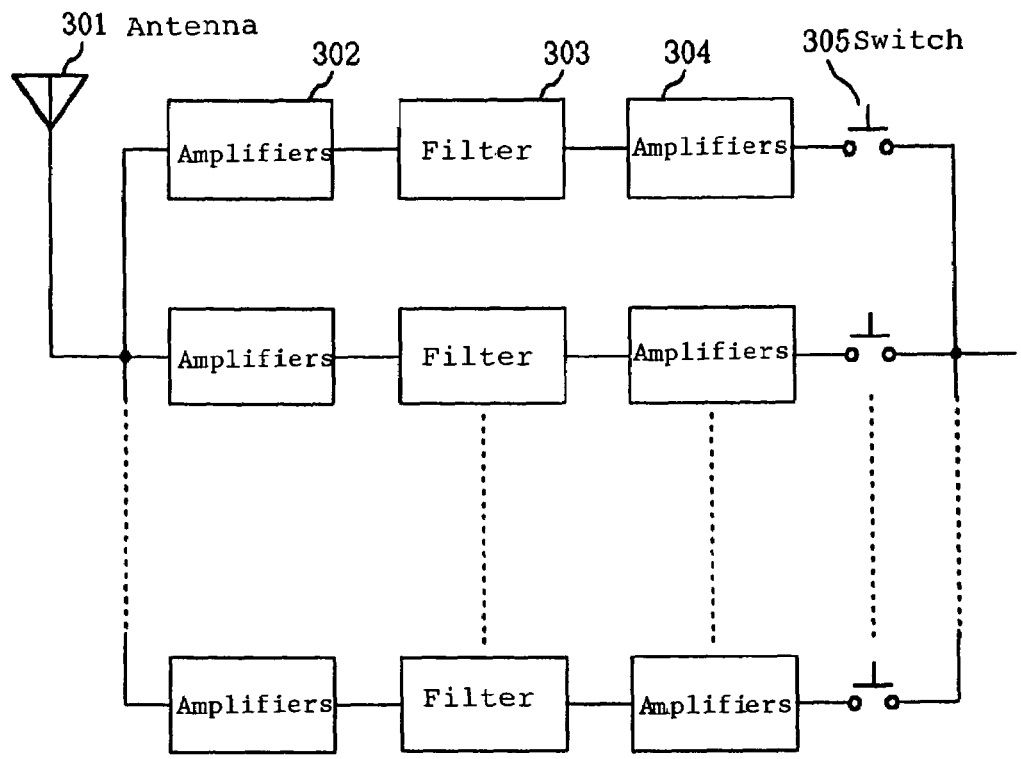
FIG. 6 is a diagram (No. 1) illustrating the configuration which comprises a plurality of filters that differ in a range in which the center frequency can be changed, for describing the first example of the present invention.
Figure 10:
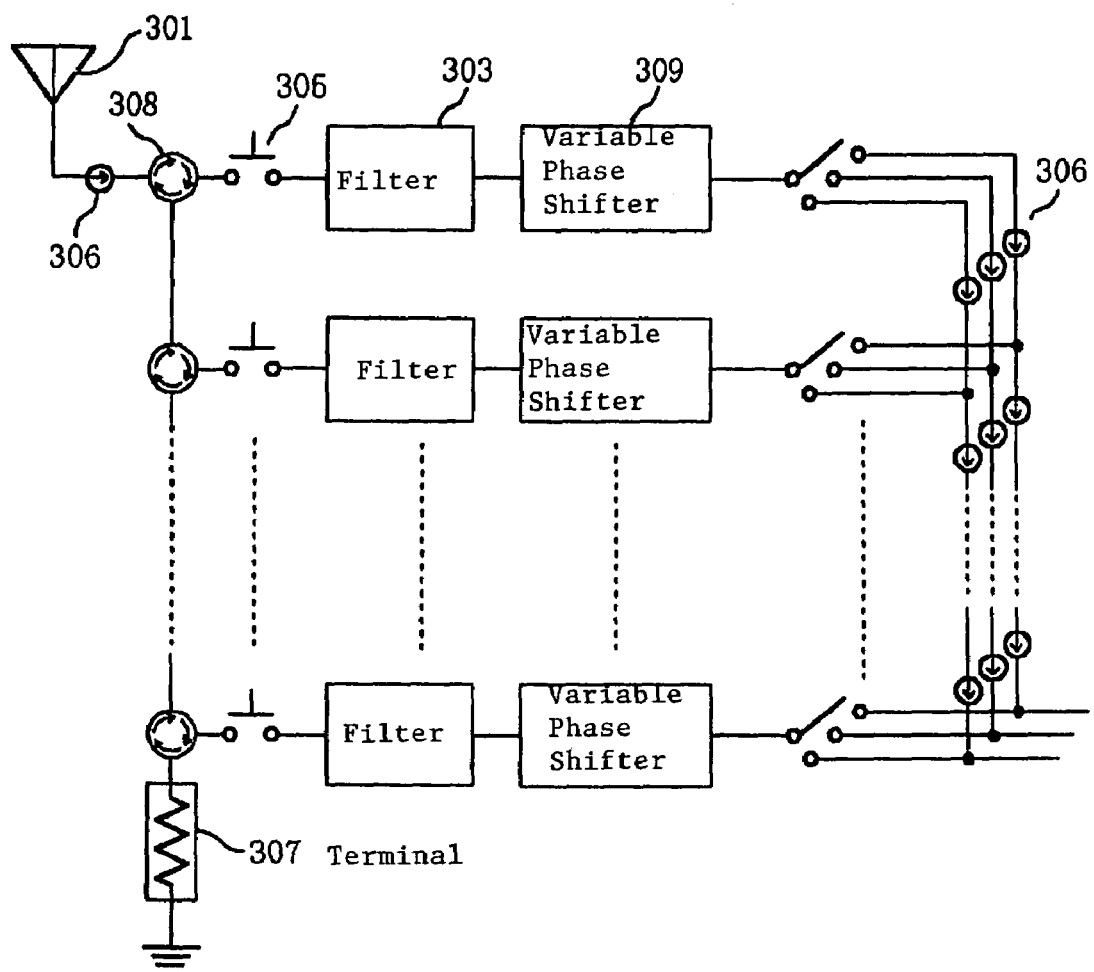
FIG. 10 is a diagram (No. 5) illustrating the configuration which comprises the plurality of filters that differ in the range in which the center frequency can be changed, for describing the first example of the present invention.
Figure 11:
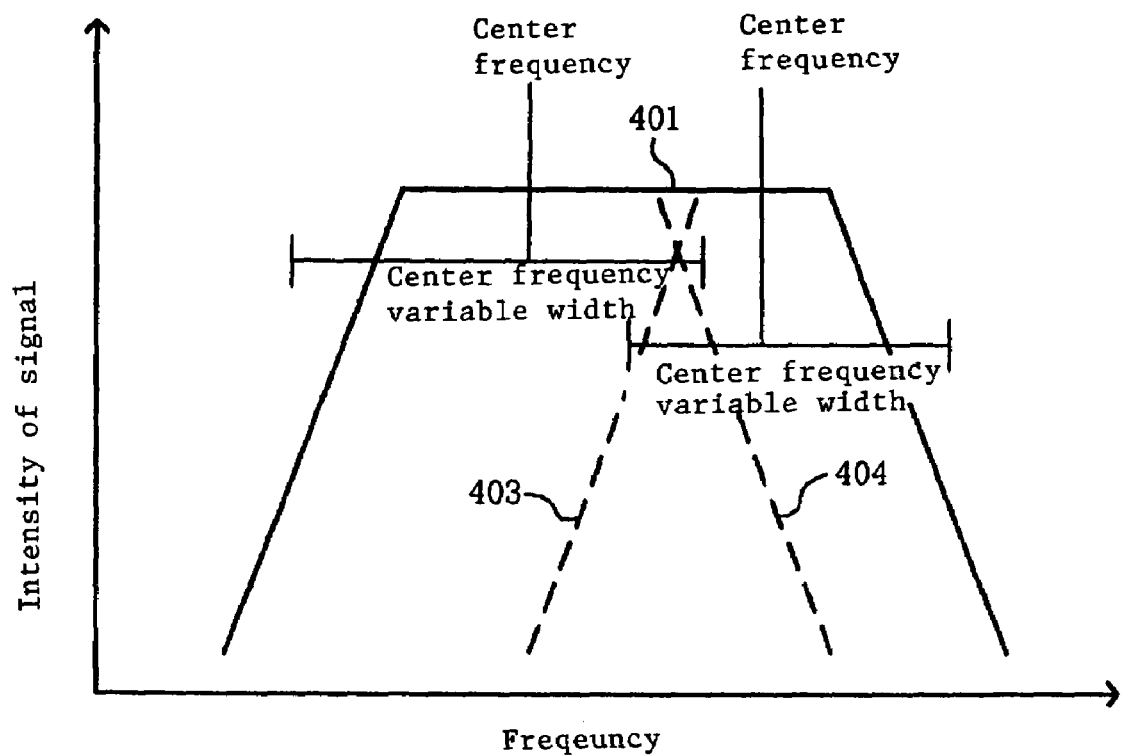
FIG. 11 is a frequency characteristic diagram when there are provided a plurality of filters which differ in the range in which the center frequency can be changed, for describing the first example of the present invention.

The center frequencies of a variety of main radio standards predominantly disperse in a band of 800 MHz or higher and 10 GHz or lower, so that the changeable frequency characteristics which can be realized by the filter element described in FIG. 4 can fail to support them in some cases. In such a case, a method shown in FIGS. 6 to 10 can be employed. Specifically, a method involves providing a plurality of filters which differ in a range in which the center frequency can be changed, combining each filter with a switch before or after the filter, providing at least each of an amplifier, an isolator or a circulator, and then connecting them with wires. According to FIG. 6, the circuit is divided into a plurality of systems after antenna 301, and subsequently connected to a plurality of amplifiers 302. This amplifier 302 is equivalent to a low-noise amplifier, for example, on a reception side, and also plays a role of establishing impedance matching when the circuit is divided into a plurality of lines. After the amplifier, there is provided filter 303, the frequency characteristics of which can be changed, followed by second-stage amplifier 304 additionally including an impedance matching function, and further followed by switch 305. Thereafter, the divided reception lines are integrated and connected to the subsequent stage. As a result, when desired frequency characteristics have a center frequency indicated by solid line 401 and a band width as shown in FIG. 11, the characteristics 401 can be realized by controlling the range in which the center frequency can be changed, i.e., the center frequencies and bandwidths of two filters which differ in center frequency variable width as indicated by 403, 404, respectively. Even when a filter element alone experiences a limited variable range for the frequency characteristics, this method can provide an extremely wide variable range for the frequency characteristics. Further, when a plurality of these filters are integrated on the same substrate, an area occupied by the filters can be made smaller than discretely configured filters.

Figure 7:
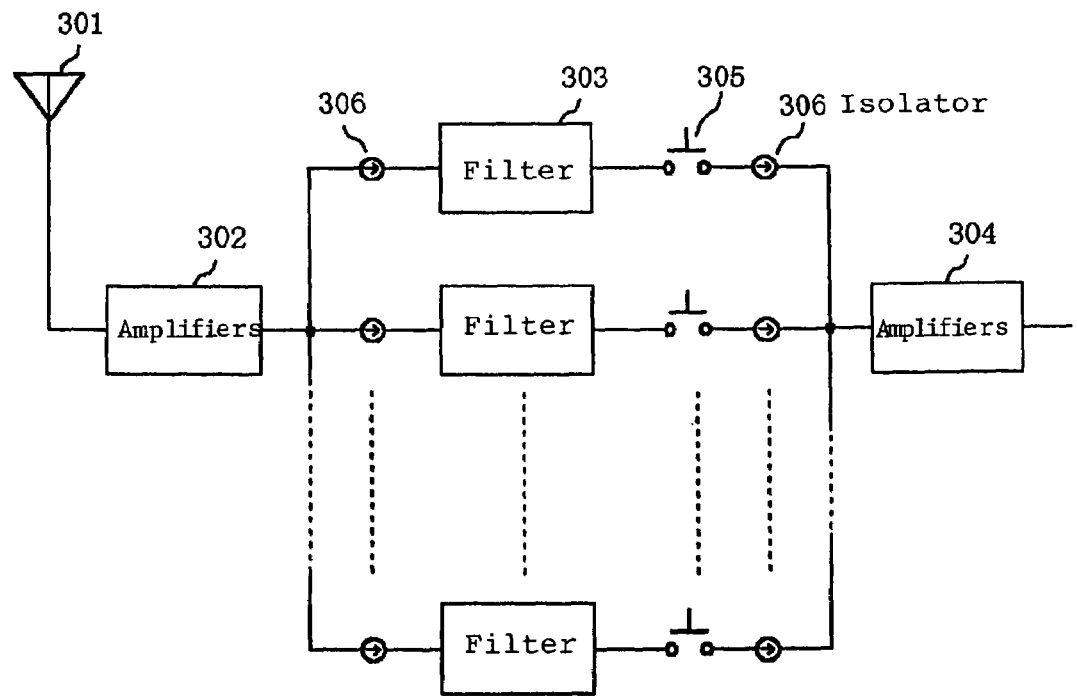
FIG. 7 is a diagram (No. 2) illustrating the configuration which comprises the plurality of filters that differ in the range in which the center frequency can be changed, for describing the first example of the present invention.
Figure 8:
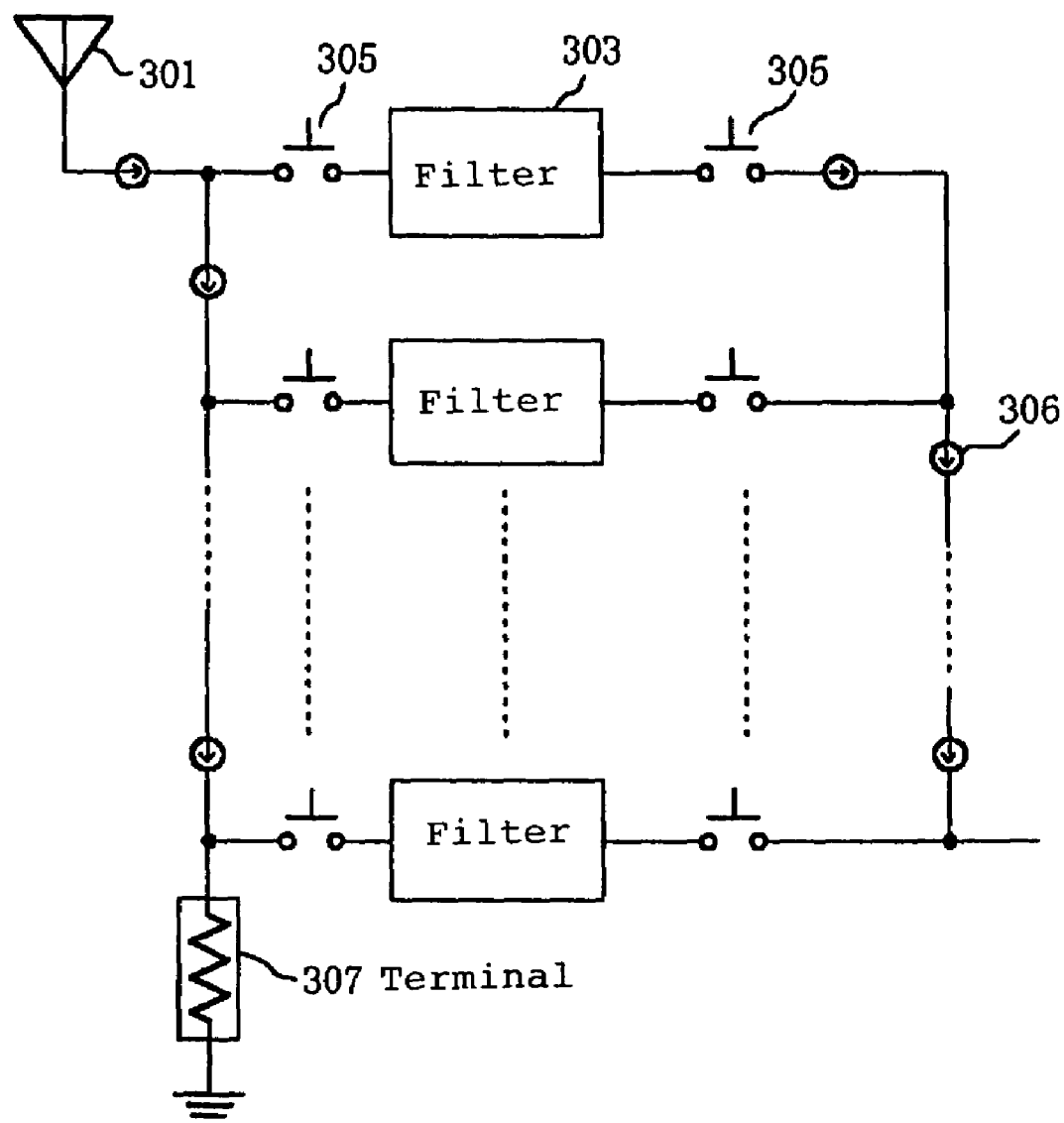
FIG. 8 is a diagram (No. 3) illustrating the configuration which comprises the plurality of filters which that in the range in which the center frequency can be changed, for describing the first example of the present invention.
Figure 9:
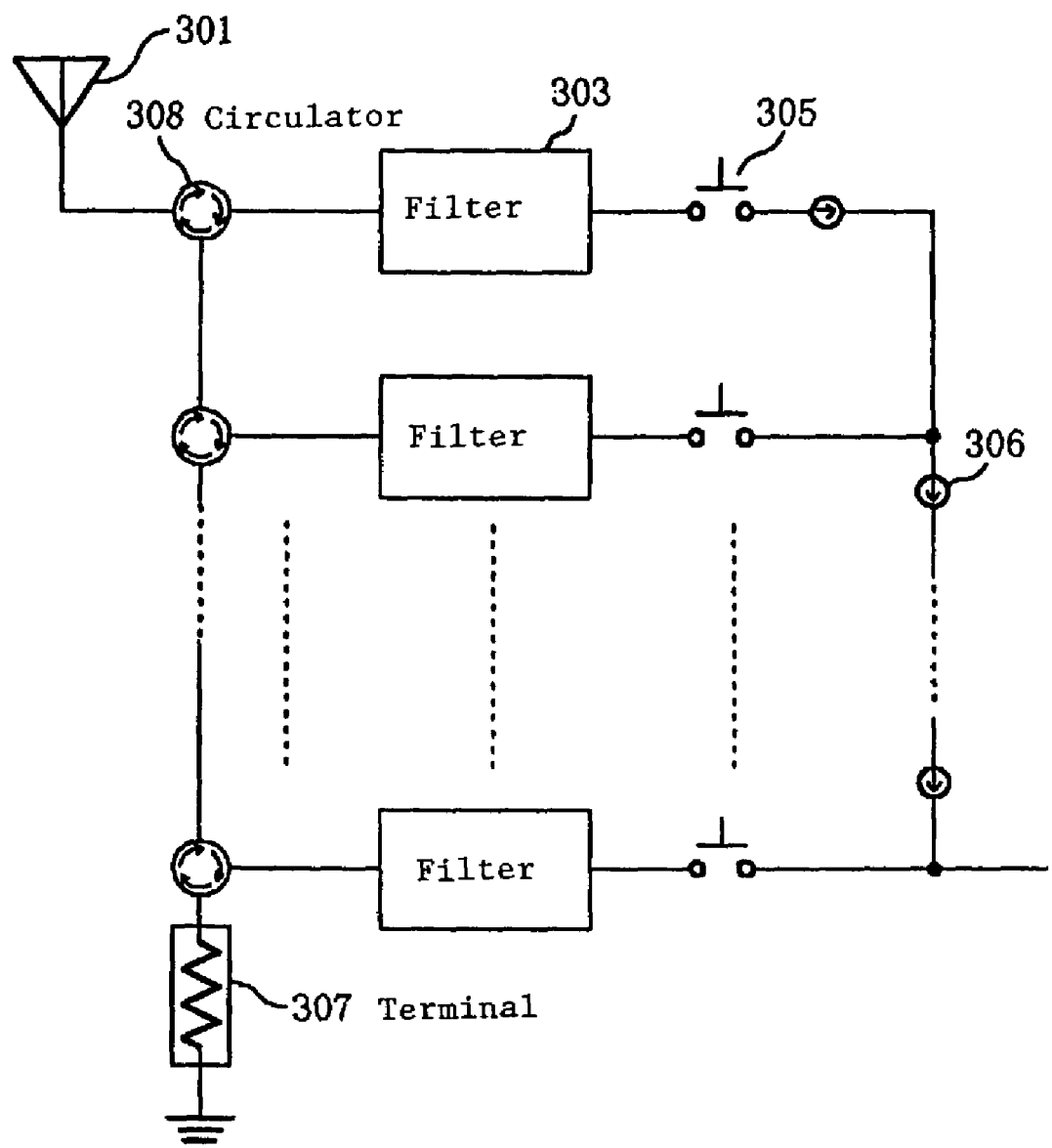
FIG. 9 is a diagram (No. 4) illustrating the configuration which comprises the plurality of filters that differ in the range in which the center frequency can be changed, for describing the first example of the present invention.

In a circuit illustrated in FIG. 7, amplifiers on the input side and on the output side are integrated into one. Specifically, a received signal incoming from antenna 301 is divided into a plurality of lines after front amplifier 302, and the respective lines are integrated and connected to rear amplifier 304 after they pass through isolator 306, filter 303, switch 305, and isolator 306 on respective branches. In a circuit illustrated in FIG. 8, a received signal is terminated by terminator 307 through isolator 306. Then, signals separated by isolator 306 are integrated through switches 305, filters 303, switches 305, and isolators 306. Also, in a circuit illustrated in FIG. 9, circulators 308 are used for branching in place of the isolators and switches. Further, in a circuit illustrated in FIG. 10, a signal received by antenna 301 is branched by circulators 308, and integrated into three lines which are separately delivered, after passing through switches 305, filters 303, and variable phase shifters 309. By using variable phase shifter 309, it is possible to prevent the output from being reduced by interference due to a phase difference produced between combined signals. Also, as illustrated in FIG. 10, with the ability to simultaneously receive signals on a plurality of channels, a plurality of telecommunications in different forms can be performed in parallel, for example, communicating data while continuing a voice telecommunication.

In the composite filters each comprising a plurality of filters illustrated in FIGS. 6 to 10, a storage circuit preferably stores on/off of the switches and phase shift angles for the variable phase shifters, which realize the frequency characteristics compatible with a variety of desired radio standards. Particularly, when signals, which have passed a plurality of filters arranged in parallel at an odd number of stages, are combined such that pass bands partially overlap with each other, the use of the phase shifter is desired because the phase angle shifts by 180 degrees per stage.

In this example, for example, the area occupied by the filter can be further reduced not only by integrating, for example, a plurality of filters on the same substrate, but also by integrating the control circuit used as a variable voltage source, storage circuit, digital/analog converter, and booster circuit in FIG. 5, or the amplifiers and switches in FIGS. 6 to 10 on the same substrate. Also, the number of parts can be reduced, so that the reliability is improved. Further, an integrated circuit chip, which has a filter according to the present invention mounted therein as part of a circuit block, involves an additional value that is the effect of reducing the number of externally attached parts, so that the chip price can be set high. Further, in electronic devices such as a mobile telephone, which contains the filter, composite filter, or integrated circuit chip according to the present invention, the effect of reducing the number of parts can realize a reduction in cost in addition to a reduction in size and an improvement in reliability.

FIG. 12 are diagrams illustrating a second example of the present invention, wherein FIG. 12A is a top plan view which additionally depicts the configuration of peripheral circuits; FIG. 12B is a front view, and FIG. 12C is a side view. This example employs a piezoelectric material for the movable mechanism which can electromechanically control the center frequency of the resonator of the filter illustrated in FIG. 4 in the first example. Specifically, opposing electrode 21 in FIG. 4 is removed, and dual-mode acoustic wave resonator 7a is supported by conductive post 29 and power supply pad 31 as well as by two piezoelectric posts 34. Piezoelectric posts 34 are disposed on power supply line 33. Conductive post 29, power supply pad 31, and piezoelectric posts 34 are disposed at sites which are nodes of vibrations of acoustic wave resonator 7a. Variable voltage source 24 is connected to power supply line 33 and acoustic wave resonator 7a. For changing the center frequency of dual-mode acoustic wave resonator 7a, a DC electric signal is applied to piezoelectric posts 34 using variable voltage source 24 to expand or contract them to curve dual-mode acoustic wave resonator 7a, thus applying a tension to dual-mode acoustic wave resonator 7a to change the resonance frequency.

Opposing electrodes 10, 11 in FIG. 4 are also removed, a voltage of variable voltage source 16 is applied between input electrode 2 and dual-mode acoustic wave resonator 7a, and a voltage of variable voltage source 17 is applied between output electrode 3 and dual-mode acoustic wave resonator 7a. Then, opening 35 is formed in each of input electrode 2 and output electrode 3, where openings 35 are formed with notches 36 on both sides. Thus, both sides of openings 35 can be provided with a spring characteristic. The resonance frequency of this spring characteristic is preferably selected so as not to interfere with the pass band of the filter. By changing the voltages of variable voltage sources 16, 17, it is possible to change the width of void 4 between input electrode 2 and dual-mode acoustic wave resonator 7a, and void 5 between output electrode 3 and dual-mode acoustic wave resonator 7a, thereby adjusting electromagnetic coupling between the input/output electrodes and acoustic wave resonator 7a. In other words, the external Q-value can be changed through this operation.

FIG. 13 are diagrams illustrating a third example of the present invention, where FIG. 13A is a top plan view which additionally depicts the configuration of peripheral circuits; FIG. 13B is a front view, and FIG. 13C is a side view. This example employs a piezoelectric material for the movable mechanism for adjusting the coupling coefficient between the resonance modes and the external Q-value of the filter in the first example. Specifically, opposing electrodes 10, 11 and opposing electrode 23 in FIG. 4 are removed, piezoelectric posts 40, 41 are disposed between power supply lines 37, 38, each having one end connected to variable voltage source 16 or 17, and input electrode 2, output electrode 3, and piezoelectric post 42 is disposed between power supply line 39 having one end connected to variable voltage source 25 and resonance mode inter-coupler 6. As the voltages of variable voltage sources 16, 17 are changed, piezoelectric posts 40, 41 expand or contract, thereby causing input electrode 2 and output electrode 3 to move up or down. This results in a change in the opposing area of an end face of input electrode 2 and an end face of output electrode 3 to end faces, opposite to them, of dual-mode acoustic wave resonator 7a, thus making it possible to change electromagnetic coupling between the input/output electrodes and acoustic wave resonator 7a. In other words, the external Q-value can be adjusted through this operation. Also, as the voltage of variable voltage source 25 is changed, piezoelectric post 42 expands or contracts, thereby causing a distortion of resonance mode inter-coupler 6 of dual-mode acoustic wave resonator 7a. This causes the coupling between both resonance modes to change, thus making it possible to adjust the coupling coefficient between the resonance modes.

Figure 14B:
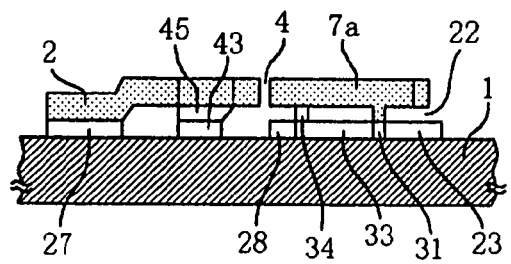
FIGS. 14A-14C are a top plan view, a front view, and a side view illustrating a fourth example of the present invention.
Figure 14A:
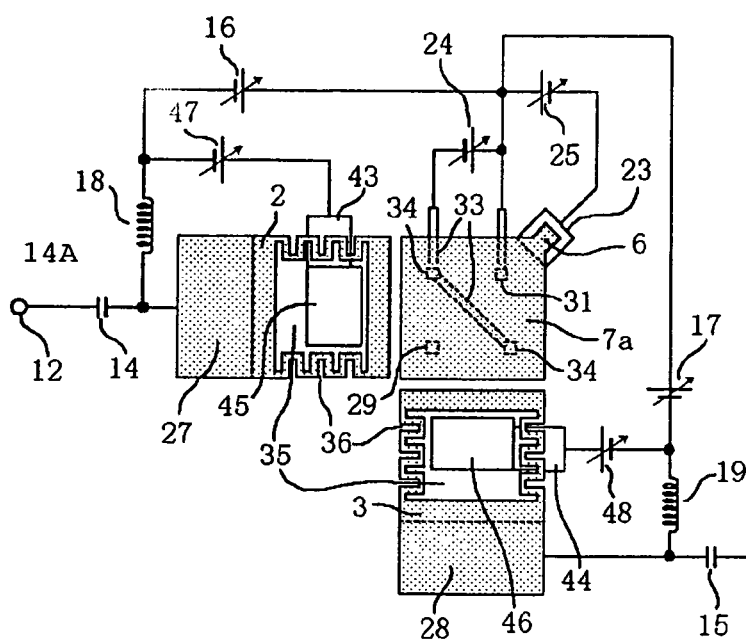
Figure 14C:
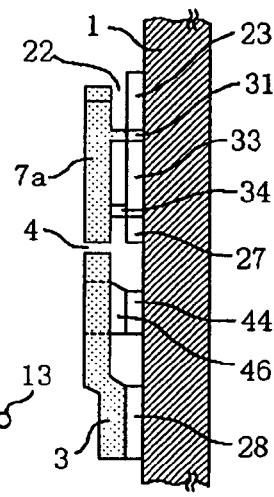

FIG. 14 are diagrams illustrating a fourth example of the present invention, wherein FIG. 14A is a top plan view which additionally depicts the configuration of peripheral circuits; FIG. 14B is a front view, and FIG. 14C is a side view. This example adds, to the second example illustrated in FIG. 12, aspiring electrodes which can absorb input electrode 2 and output electrode 3, and serve as a movable mechanism for changing the external Q-value. Specifically, aspiring electrodes 45, 46 are disposed within openings 35 formed through input electrode 2 and output electrode 3, and they are placed on power supply lines 43, 44, each having one end connected to variable voltage source 47 or 48. Also, in this example, notches 36 are formed outside of openings 35 as well. According to this example, by providing aspiring electrodes 45, 46, movable ranges can be increased for the input/output electrodes in combination with variable voltage sources 16, 17 to increase a range in which the external Q-value is adjusted. Alternatively, the use of variable voltage sources 16, 17 can be stopped to prevent interference from occurring between the adjustment of the external Q-value and the adjustment of the center frequency of the resonator by stopping.

Figure 15A:
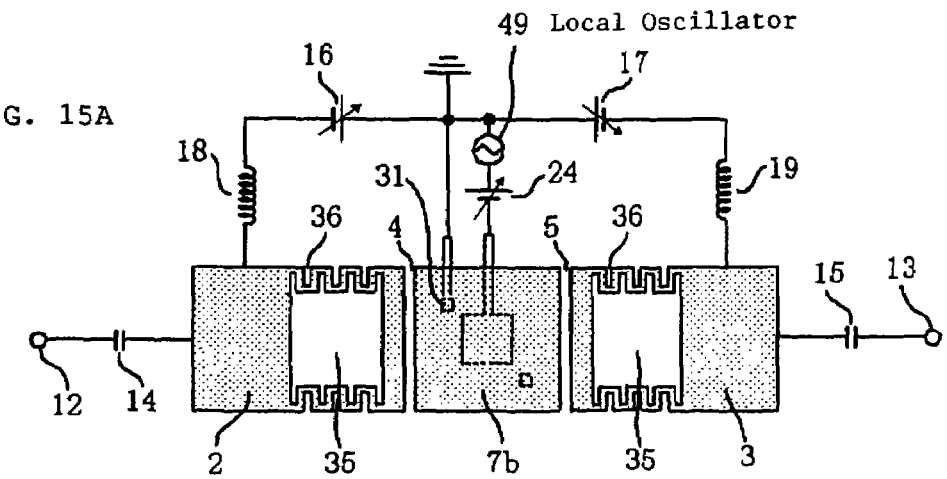
FIGS. 15A-15B are a top plan view and a front view illustrating a fifth example of the present invention.
Figure 15B:
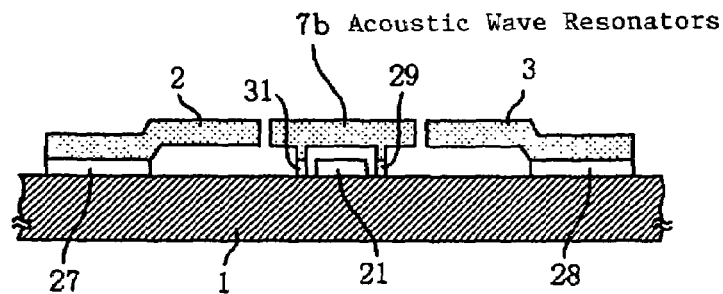

FIG. 15 are diagrams illustrating a fifth example of the present invention, wherein FIG. 15A is a top plan view which additionally depicts the configuration of peripheral circuits, and FIG. 15B is a front view. In FIG. 15, parts equivalent to parts in the other examples are designated the same reference numerals. This example solely has single-mode acoustic wave resonator 7b. Therefore, in this example, no adjustment is made for the coupling coefficient between resonance modes. In this example, the central frequency of the resonator is adjusted by changing the voltage of variable voltage source 24 which is applied between acoustic wave resonator 7b and opposing electrode 10, and the external Q-value is adjusted by changing the voltages of variable voltage sources 16, 17 applied between input electrode 2 and acoustic wave resonator 7b and between output electrode 3 and acoustic wave resonator 7b. By changing the external Q-value with the center frequency of the resonator maintained constant, it is possible to adjust a rising characteristic in a frequency-output magnitude characteristic of the resonator, and to adjust a group delay characteristic of the resonator.

By inserting local oscillator 49 between opposing electrode 10 and ground, the filter of this example can be operated as a converter which additionally has a mixer function. The local oscillator may be inserted between input electrode 2 and ground, or between output electrode 3 and ground, or between power supply pad 31 and ground. Also, a signal of the local oscillator may be applied to a filter which comprises a dual-mode acoustic wave resonator or multiple-stage acoustic wave resonators.

Figure 16A:
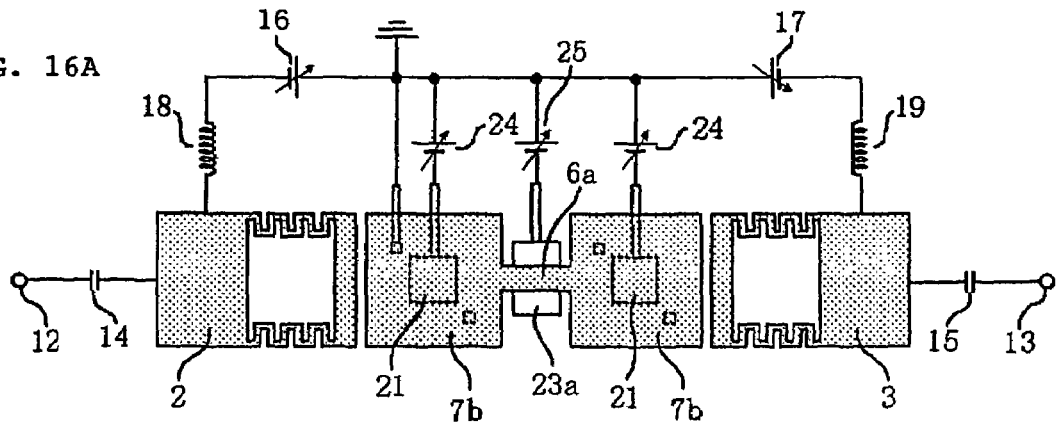
FIGS. 16A-16B are a top plan view and a front view illustrating a sixth example of the present invention.
Figure 16B:
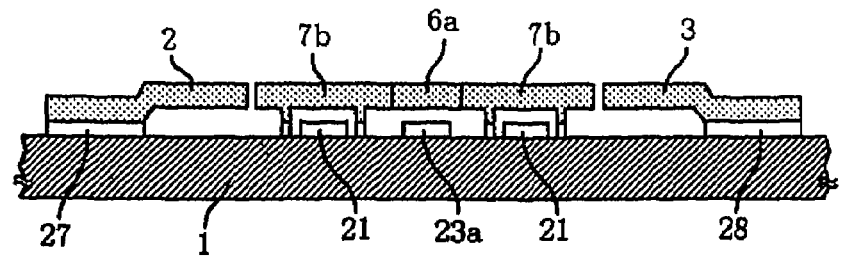

FIG. 16 are diagrams illustrating a sixth example of the present invention, wherein FIG. 16A is a top plan view which additionally depicts the configuration of peripheral circuits, and FIG. 16B is a front view. In FIG. 16, parts equivalent to parts in the other examples are designated the same reference numerals. In this example, two acoustic wave resonators 7b are disposed between input electrode 2 and output electrode 3, and two acoustic wave resonator 7b are connected to one end of resonance mode inter-coupler 6a, respectively. Opposing electrode 23a is disposed below resonance mode inter-coupler 6a, and a distortion of resonance mode inter-coupler 6a can be adjusted by changing a voltage applied to opposing electrode 23a by variable voltage source 25, thereby changing the coupling degree of two acoustic wave resonators 7b to each other to adjust the coupling coefficient between the resonators. Also, by changing a voltage applied to opposing electrodes 21 disposed in close proximity to acoustic wave resonators 7b by variable voltage source 24, the center frequencies of the two resonators can be adjusted, and by changing voltages applied to input electrode 2 and output electrode 3 by variable voltage sources 16, 17, the external Q-values of the resonators can be adjusted.

Figure 17A:
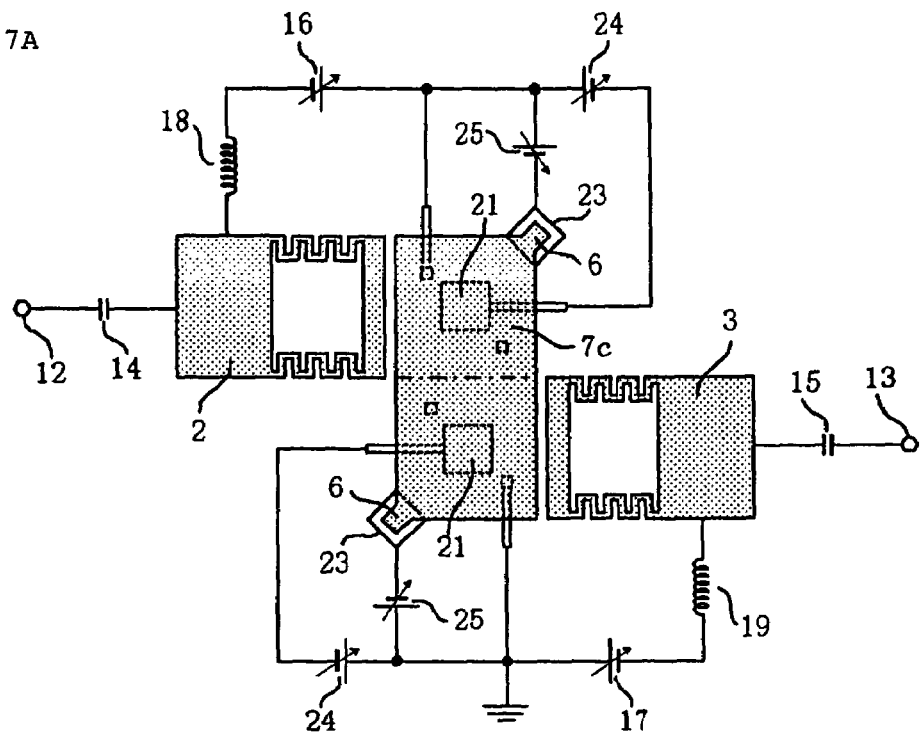
FIGS. 17A-17C are a top plan view, a front view, and an operation description diagram illustrating a seventh example of the present invention.
Figure 17B:
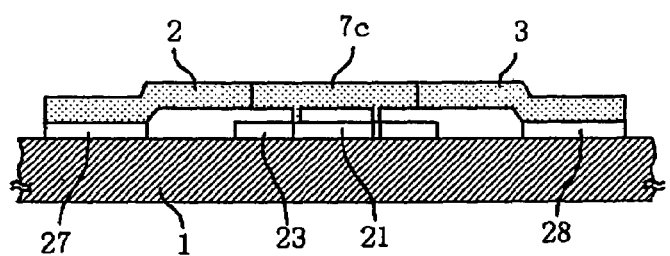
Figure 17C:

FIG. 17 are diagrams illustrating a seventh example of the present invention, wherein FIG. 17A is a top plan view which additionally depicts the configuration of peripheral circuits, FIG. 17B is a front view, and FIG. 17C is an operation description diagram centered on the resonance mode. In FIG. 17, parts equivalent to parts in the other examples are designated the same reference numerals. This example relates to a three-stage filter using a single acoustic wave resonator. In this example, triple-mode acoustic wave resonator 7c is disposed between input electrode 2 and output electrode 3 across narrow gaps therebetween. Corners of triple-mode acoustic wave resonator 7c away from input electrode 2 and output electrode 3 is formed with resonance mode inter-couplers 6. As illustrated in FIG. 17C, three modes are formed for acoustic wave resonator 7c, and two intersecting resonance modes are coupled by resonance mode inter-couplers 6, respectively.

Figure 18:
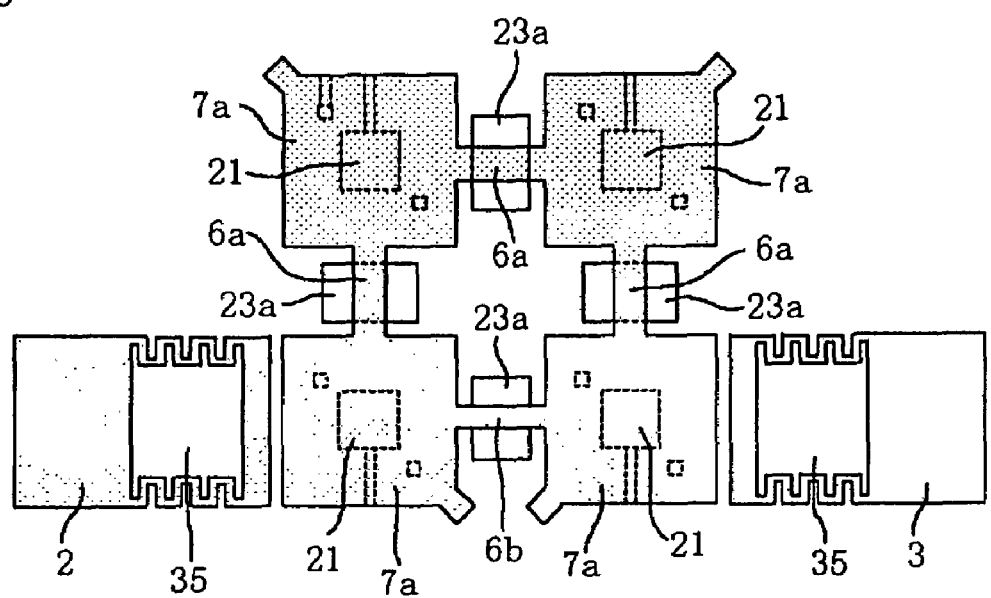
FIG. 18 is a top plan view illustrating an eighth example of the present invention.

FIG. 18 is a top plan view illustrating an eighth example of the present invention. This example relates to a cross-coupled eight-stage filter. In FIG. 17, parts equivalent to parts in the other examples are designated the same reference numerals. In this example, four dual-mode acoustic wave resonators 7a are disposed between input electrode 2 and output electrode 3, and sequentially coupled by resonance mode inter-couplers 6a, while first-stage acoustic wave resonator 7a and last-stage acoustic wave resonator 7a are connected by resonance mode inter-coupler 6b which provides cross-coupling. Opposing electrodes 23a are disposed below resonance mode inter-couplers 6a, 6b, respectively, such that the coupling degree between two resonance modes can be adjusted respectively by adjusting voltages applied to opposing electrodes 23a. As illustrated in FIG. 18, the selectivity of the filter can be improved, and the group delay characteristic can be improved by cross-coupling between the resonance modes.

Figure 19A:
FIGS. 19A-19G are cross-sectional views of the order of steps for describing a manufacturing method in the first example of the present invention.

Next, a method of manufacturing the first example of the present invention will be described with reference to FIG. 19. FIGS. 19A to 19G are cross-sectional views taken along the B-B line in FIG. 4 in the order of steps for describing the method of manufacturing the first example of the present invention. Al film 50 is deposited on substrate 1 which comprises Si substrate 1a covered with SiN film 1b by a sputtering method (FIG. 19A).

Figure 19B:
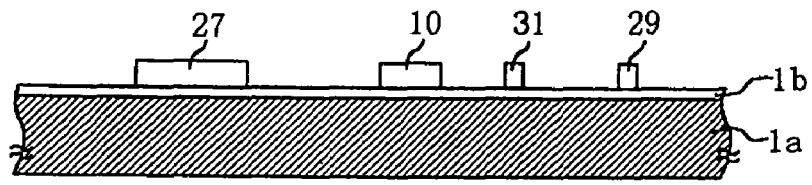
Figure 19C:
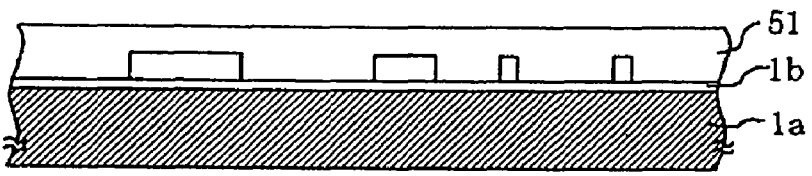
Figure 19D:
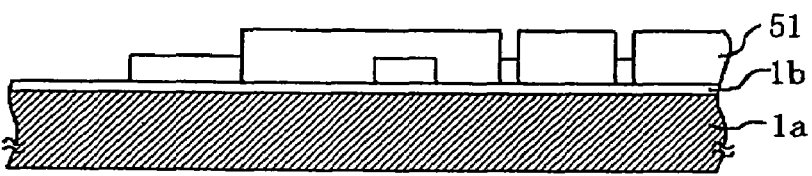
Figure 19E:
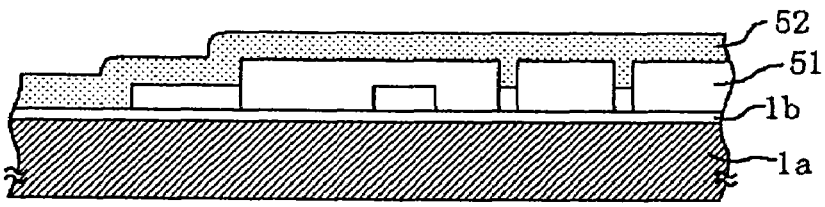
Figure 19F:
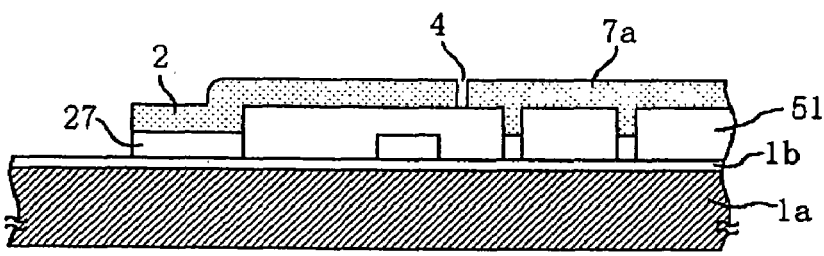
Figure 19G:
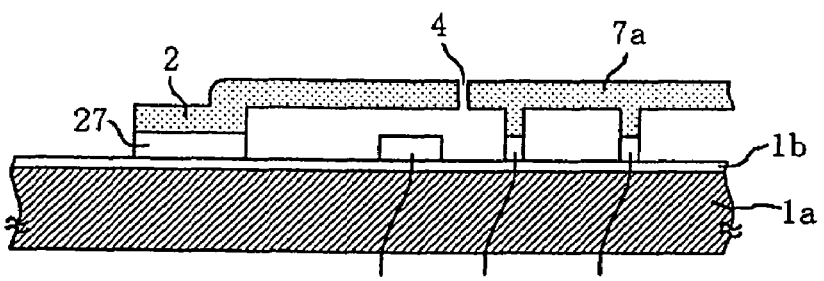

Next, Al film 50 is patterned by a photolithographic method and RIE (reactive ion etching) to form opposing electrode 10, conductive posts 27, 29, and power supply pad 31 (FIG. 19B). Next, SiO2 film 51 is deposited by a CVD method (FIG. 19C), and is patterned to expose the surfaces of conductive posts 27, 29 and power supply pad 31 (FIG. 19D). Next, Al film 52 is deposited by a sputtering method (FIG. 19E), and is patterned by a photo-etching method such that input electrode 2, dual-mode acoustic wave resonator 7a, and output electrode are in a continuous state. Next, narrow voids 4 are formed between input electrode 2 and dual-mode acoustic wave resonator 7a and between the output electrode and dual-mode acoustic wave resonator 7a by a focused ion beam (FIB) milling method (FIG. 19F). The width of voids 4 can be narrowed down to approximately 5 nm by use of this focused ion beam milling. Finally, residual SiO2 film 51 is removed by a wet etching method, and the filter is completed using a drying method using a supercritical fluid (FIG. 19G).

Figure 20A:
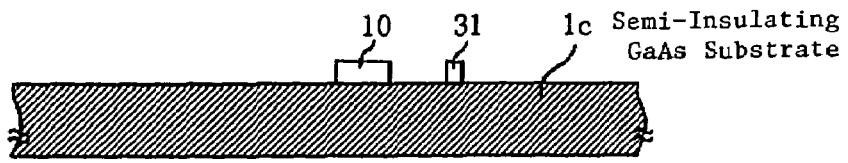
FIGS. 20A-20F are cross-sectional views of the order of steps for describing a manufacturing method in a ninth example of the present invention.
Figure 20B:
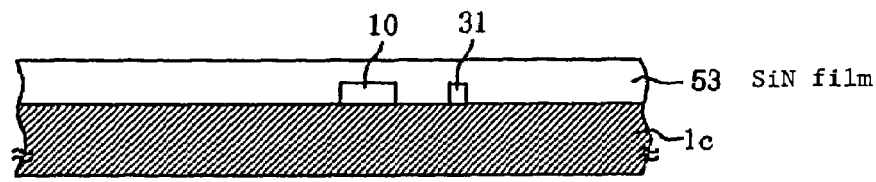
Figure 20C:
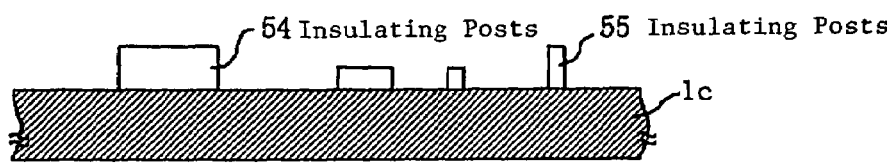
Figure 20D:
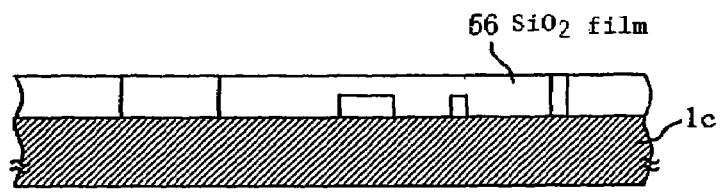
Figure 20E:
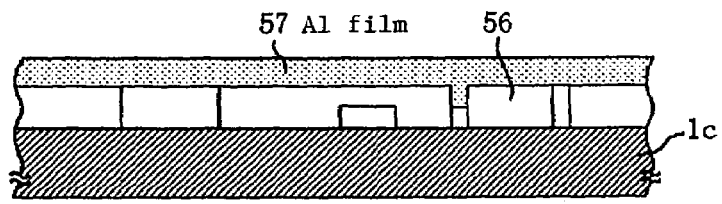
Figure 20F:
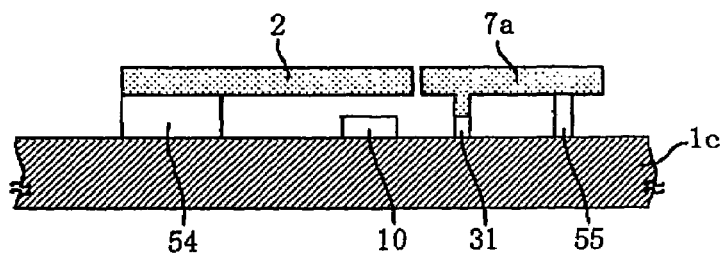

FIGS. 20A to 20F are cross-sectional views, in the order of steps, for describing a manufacturing method according to a ninth example of the present invention. An Al film is deposited on semi-insulating GaAs substrate 1c, and is patterned to form opposing electrode 10 and power supply pad 31 (FIG. 20A). Next, SiN film 53 is deposited (FIG. 20B), and is patterned to form insulating posts 54, 55 (FIG. 20C). SiO2 film 56 is deposited, the surface of which is planarized by CMP (chemical mechanical polishing) to expose the surfaces of insulating posts 54, 55 (FIG. 20D). Next, SiO2 film 56 is selectively etched to expose the surface of power supply pad 31, followed by deposition of Al film 57 by a sputtering method (FIG. 20E). Al film 57 is patterned using electron beam lithography to form input electrode 2 and dual-mode acoustic wave resonator 7a, followed by removal of residual SiO2 film 56 using isotropic dry etching method (FIG. 20F).

Figure 21:
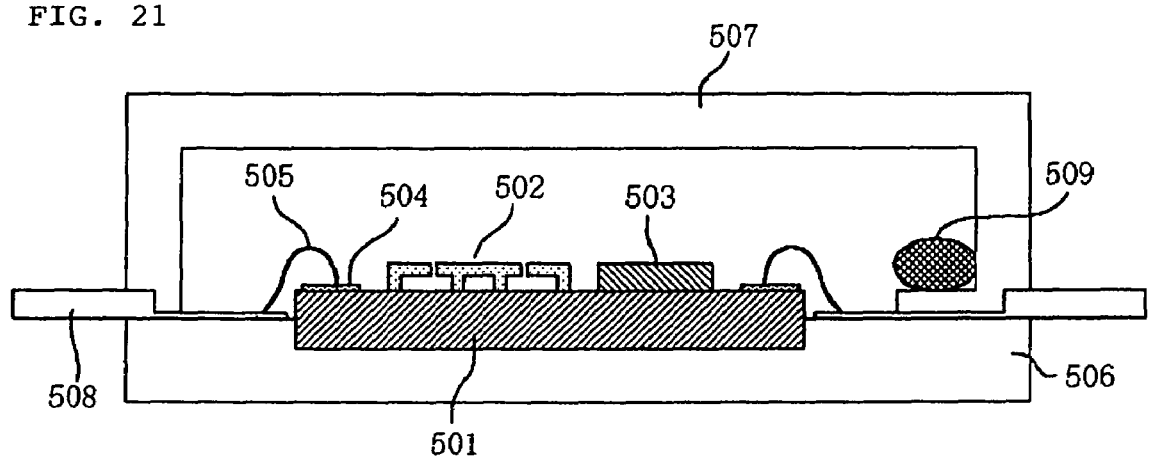
FIG. 21 is a cross-sectional view illustrating an example of filter mounting means of the present invention.

FIG. 21 is a cross-sectional view illustrating an exemplary means of mounting a filter according to the present invention. A peripheral circuit including a memory and a processing circuit may be formed on a substrate on which the filter is formed, or formed on a separate substrate, and the illustrated example relates to the former one. Filter 502 and associated peripheral circuit 503 are formed on substrate 501, and pads 504 are formed along the periphery of the substrate. Substrate 501 is mounted on package base 506 which comprises external terminals 508, and pads 504 are connected to inner leads of external terminals 508 through bonding wires 505. Subsequently, package lid 507 is overlaid to hermetically seal the filter. A getting material 509 is disposed within the package for adsorbing moisture, oxygen and the like. In this way, it is possible to limit changes in the characteristics of the filter due to adsorption of moisture and surface oxidization. The substrate may be mounted in a package by a flip-chip method with bumps disposed on the substrate, instead of the die-bond based mounting method.

While the features of the present invention have been described in connection with preferred embodiments thereof, the present invention is not limited to such embodiments, but modifications can be made as appropriate without departing from the spirit and scope of the invention. For example, means other than those in the embodiments, such as a magnetostrictive device and the like may be used for the electromechanical transduction mechanism. Also, while description has been made with a reception system in mind in FIGS. 6 to 10, a filter comprising a plurality of filters in parallel can be applied to a transmission system as well since it is apparent that the filter element can be applied to both transmission and reception systems.

The invention claimed is:

1. A filter having an input electrode, an output electrode, and a single acoustic wave resonator disposed between said input electrode and said output electrode, formed on a substrate, said acoustic wave resonator having one resonance mode for use as a filter, wherein:

said filter has a number of structures capable of simultaneously and independendy changing all parameters for determining frequency characteristics of said filter, said parameters including a center frequency of said acoustic wave resonator, an external Q-value between said acoustic wave resonator and said input electrode, and an external Q-value between said acoustic wave resonator and said output electrode, said structures being capable of being simultaneously applied with electric signals independently of one another, said number of structures being at least equal to the number of the parameters, and said filter includes an electromechanical transducer having a function capable of mechanically deforming one portion of each of said structures of said filter simultaneously and with finite dependency by individually applying the electric signals to electrodes disposed in said structures, respectively.

2. The filter according to claim 1, wherein said electromechanical transducer is a mechanism which is capable of mechanically deforming a portion of each of said structures of said filter through an electrostatic force or through deformation of a piezoelectric material by applying the electric signal.

3. The filter according to claim 2, wherein end faces of said acoustic wave resonator are opposite to an end face of said input electrode and an end face of said output electrode across predetermined gaps, and said filter includes, as said electromechanical transducer, a mechanism for changing the distances between the end faces of said acoustic wave resonator and the end faces of said input electrode and said output electrode, or areas of the end faces that are opposite to each other through an electrostatic force or through deformation of a piezoelectric material.

4. The filter according to claim 2, including, as said electromechanical transducer, a mechanism for mechanically deforming a portion of said acoustic wave resonator through an electrostatic force or through deformation of the piezoelectric material.

5. The filter according to claim 4, wherein said electromechanical transducer is a mechanism which changes a tension applied to said acoustic wave resonator with a mechanical deformation of a portion of said acoustic wave resonator.

6. A composite filter comprising a plurality of the filters that are in parallel according to claim 1, said filters having changeable center frequency ranges different from one another.

7. The composite filter according to claim 6, wherein each of said filters is formed on the same substrate.

8. A filter assembly comprising the composite filter according to claim 6 hermetically sealed in a package.

9. A method of changing frequency characteristics of the composite filter according to claim 6, comprising the step of changing the frequency characteristics of each filter to change the frequency characteristics of said composite filter.

10. A filter assembly comprising the filter according to claim 1 hermetically sealed in a package.

11. A method of changing frequency characteristics of a filter, comprising the steps of:
applying the filter according to claim 1 with a first electric signal to mechanically deform said acoustic wave resonator to change the center frequency of said resonator; and,
applying the filter according to claim 1 with a second and a third electric signal to change a relative position of the input electrode to the acoustic wave resonator and to change a relative position of the output electrode to the acoustic wave resonator to change the external Q-value.

12. A filter having an input electrode, an output electrode, and a resonator unit including at least one acoustic wave resonator disposed between said input electrode and said output electrode and comprising a plurality of acoustic wave resonance modes for use as a filter within said acoustic wave resonator, said input electrode, said output electrode, and said resonator unit being formed on a substrate, wherein:
said filter has a number of structures capable of simultaneously and independently changing all parameters for determining frequency characteristics of said filter, said parameters including a coupling coefficient between the plurality of resonance modes of said resonator unit, a center frequency, an external Q-value between said acoustic wave resonator and said input electrode, and an external Q-value between said acoustic wave resonator and said output electrode, said structures being capable of being simultaneously applied with electric signals independently of one another, said number of structures being at least equal to the number of the parameters, and
said filter includes an electromechanical transducer having a function capable of mechanically deforming one portion of each of said structures of said filter simultaneously and with finite dependency by individually applying the electric signals to electrodes disposed in said structures, respectively.

13. The filter according to claim 12, wherein said electromechanical transducer is a mechanism which is capable of mechanically deforming a portion of each of said structures of said filter through an electrostatic force or through deformation of a piezoelectric material by applying the electric signal.

14. The filter according to claim 13, wherein end faces of said acoustic wave resonator are opposite to an end face of said input electrode and an end face of said output electrode across predetermined gaps, and said filter includes, as said electromechanical transducer, a mechanism for changing the distances between the end faces of said acoustic wave resonator and the end faces of said input electrode and said output electrode, or areas of the end faces that are opposite to each other through an electrostatic force or through deformation of a piezoelectric material.

15. The filter according to claim 13, including, as said electromechanical transducer, a mechanism for mechanically deforming a portion of said acoustic wave resonator through an electrostatic force or through deformation of the piezoelectric material.

16. The filter according to claim 15, wherein said electromechanical transducer is a mechanism which changes a tension applied to said acoustic wave resonator with a mechanical deformation of a portion of said acoustic wave resonator.

17. A composite filter comprising a plurality of the filters that are in parallel according to claim 12, said filters having changeable center frequency ranges different from one another.

18. The composite filter according to claim 17, wherein each of said filters is formed on the same substrate.

19. A filter assembly comprising the composite filter according to claim 17 hermetically sealed in a package.

20. A method of changing frequency characteristics of the composite filter according to claim 17, comprising the step of changing the frequency characteristics of each filter to change the frequency characteristics of said composite filter.

21. A method of changing frequency characteristics of a filter, comprising the steps of:
applying the filter according to claim 12 with one or a plurality of first electric signals to mechanically deform said acoustic wave resonator to change the center frequency of a plurality of resonance modes of the resonator unit;
applying the filter according to claim 12 with a second and a third electric signal to change a relative position of the input electrode to the acoustic wave resonator and to change a relative position of the output electrode to the acoustic wave resonator to change the external Q-value; and
applying the filter according to claim 12 with one or a plurality of fourth electric signals to deform each of a plurality of sites which provide coupling between the resonance modes of said resonator unit to change the coupling coefficient between the resonance modes.

22. A filter assembly comprising the filter according to claim 12 hermetically sealed in a package.

* * * * *

UNITED STATES PATENT AND TRADEMARK OFFICE
CERTIFICATE OF CORRECTION

PATENT NO. : 7,348,867 B2 Page 1 of 1
APPLICATION NO. : 10/528605
DATED : March 25, 2008
INVENTOR(S) : Wataru Hattori It is certified that error appears in the above-identified patent and that said Letters Patent is hereby corrected as shown below:

On the Title Page Item (30) should read

Foreign Application Priority Data
September 19, 2002 (JP) .....................2002-272564

Signed and Sealed this

Twenty-sixth Day of August, 2008

JON W. DUDAS
*Director of the United States Patent and Trademark Office*